US011430800B2

(12) United States Patent
Kim et al.

(10) Patent No.: US 11,430,800 B2
(45) Date of Patent: Aug. 30, 2022

(54) VERTICAL SEMICONDUCTOR DEVICES

(71) Applicant: SAMSUNG ELECTRONICS CO., LTD., Suwon-si (KR)

(72) Inventors: Sunggil Kim, Yongin-si (KR); Seulye Kim, Seoul (KR); Dongkyum Kim, Suwon-si (KR); Sungjin Kim, Hwaseong-si (KR); Junghwan Kim, Seoul (KR); Chanhyoung Kim, Suwon-si (KR); Jihoon Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 189 days.

(21) Appl. No.: 16/839,184

(22) Filed: Apr. 3, 2020

(65) Prior Publication Data
US 2020/0411536 A1   Dec. 31, 2020

(30) Foreign Application Priority Data

Jun. 26, 2019 (KR) .................. 10-2019-0076579

(51) Int. Cl.
| | |
|---|---|
| *H01L 27/11582* | (2017.01) |
| *H01L 27/11556* | (2017.01) |
| *H01L 27/11519* | (2017.01) |
| *H01L 27/11524* | (2017.01) |
| *H01L 27/11558* | (2017.01) |

(52) U.S. Cl.
CPC .. *H01L 27/11556* (2013.01); *H01L 27/11519* (2013.01); *H01L 27/11524* (2013.01); *H01L 27/11558* (2013.01)

(58) Field of Classification Search
CPC .................................................. H01L 27/11582
See application file for complete search history.

(56) References Cited

U.S. PATENT DOCUMENTS

| | | | |
|---|---|---|---|
| 9,224,752 B1 | 12/2015 | Lee et al. | |
| 9,424,931 B2 | 8/2016 | Choi et al. | |
| 9,455,263 B2 | 9/2016 | Zhang et al. | |
| 9,508,730 B2 | 11/2016 | Lee et al. | |
| 9,978,771 B2 | 5/2018 | Hwang | |
| 10,062,707 B2 | 8/2018 | Lee | |
| 10,128,264 B2 | 11/2018 | Lee | |
| 2017/0084696 A1* | 3/2017 | Lee | H01L 27/11565 |
| 2018/0366486 A1* | 12/2018 | Hada | H01L 27/11556 |
| 2020/0357815 A1* | 11/2020 | Iwai | H01L 21/76805 |

* cited by examiner

*Primary Examiner* — Christopher A Johnson
(74) *Attorney, Agent, or Firm* — Volentine, Whitt & Francos, PLLC

(57) ABSTRACT

A vertical semiconductor device may include a stacked structure, a channel structure and a lower connection structure. The stacked structure may include insulation layers and gate electrodes alternately repeatedly stacked. The stacked structure may be spaced apart from an upper surface of a substrate. The channel structure may include a charge storage structure and a channel. The channel structure may pass through the stacked structure. The lower connection structure may be formed on the substrate. The lower connection structure may be electrically connected with the channel and the substrate. A sidewall of the lower connection structure may include a protrusion disposed at a central portion of the sidewall from the upper surface of the substrate in a vertical direction. The vertical semiconductor device may have a high reliability.

19 Claims, 32 Drawing Sheets

VERTICAL SEMICONDUCTOR DEVICES

CROSS-REFERENCE TO RELATED APPLICATION

This application claims priority under 35 USC § 119 to Korean Patent Application No. 10-2019-0076579, filed on Jun. 26, 2019, in the Korean Intellectual Property Office (KIPO), the contents of which are incorporated by reference herein in their entirety.

BACKGROUND

1. Field

Example embodiments relate to vertical semiconductor devices and method of manufacturing the same.

2. Description of the Related Art

A vertical NAND flash memory device may include a lower connection structure for electrically connecting a lower sidewall of a channel and a substrate. However, the lower connection structure may be difficult to have a stable structure. Therefore, the vertical NAND flash memory device may have a poor reliability due to the lower connection structure.

SUMMARY

Example embodiments provide a vertical semiconductor device including excellent electrical characteristics.

Example embodiments provide a method of manufacturing a vertical semiconductor device including excellent electrical characteristics.

According to example embodiments, there is provided a vertical semiconductor device that may include a stacked structure, a channel structure and a lower connection structure. The stacked structure may include insulation layers and gate electrodes alternately repeatedly stacked. The stacked structure may be spaced apart from an upper surface of a substrate. The channel structure may include a charge storage structure and a channel. The channel structure may pass through the stacked structure. The lower connection structure may be formed on the substrate. The lower connection structure may be electrically connected with the channel and the substrate. A sidewall of the lower connection structure may include a protrusion disposed at a central portion of the sidewall from the upper surface of the substrate in a vertical direction.

According to example embodiments, there is provided a vertical semiconductor device that may include a support layer, a stacked structure, a channel structure and a lower connection structure. The support layer may be spaced apart from an upper surface of a substrate. The stacked structure may be formed on the support layer. The stacked structure may include insulation layers and gate electrodes alternately and repeatedly stacked. The channel structure may pass through the stacked structure and the support layer, and may extend to the upper surface of the substrate. The channel structure may include a charge storage structure and a channel. The lower connection structure may be formed on the substrate. The lower connection structure may be electrically connected with the channel and the substrate. An end portion of the lower connection structure disposed at a central portion in a vertical direction from the upper surface of the substrate may protrude from an end portion of each of the lower connection structure formed on a bottom of the support layer and the lower connection structure formed on the upper surface of the substrate.

According to example embodiments, there is provided a vertical semiconductor device that may include a stacked structure, a channel structure and a lower connection structure. The stacked structure may include insulation layers and gate electrodes alternately and repeatedly stacked. The stacked structure may be spaced apart from an upper surface of a substrate. The channel structure may pass through the stacked structure, and may extend to an upper surface of the substrate. The channel structure may include a charge storage structure and a channel. The lower connection structure may contact the substrate to fill a gap between a surface of the substrate and the stacked structure. The lower connection structure may be electrically connected with the channel and the substrate. The lower connection structure may include a channel connection pattern and a protective pattern. The protective pattern may include a material having an etching rate lower than that of the channel connection pattern, in the same etching process.

According to example embodiments, there is provided a vertical semiconductor device that may include a stacked structure, a channel structure and a lower connection structure. The stacked structure may include insulation layers and gate electrodes alternately and repeatedly stacked. The stacked structure may be spaced apart from an upper surface of a substrate. The channel structure may pass through the stacked structure, and may extend to an upper surface of the substrate. The channel structure may include a charge storage structure and a channel. The lower connection structure may contact the substrate to fill a gap between a surface of the substrate and the stacked structure. The lower connection structure may be electrically connected with the channel and the substrate. The channel may include an upper channel and a lower channel. The upper channel and the lower channel may be spaced apart from each other in a vertical direction. The lower connection structure may be electrically connected with the upper channel and the lower channel.

According to example embodiments, there is provided a method of manufacturing a vertical semiconductor device. In the method, a first sacrificial layer may be formed on the substrate. A mold structure may be formed on the first sacrificial layer. The mold structure may include insulation layers and second sacrificial layers alternately and repeatedly stacked. A channel structure may be formed to pass through the mold structure, and the channel structure may extend to an upper surface of the substrate. The channel structure may include a charge storage structure and a channel. The first sacrificial layer may be removed to form a gap between a surface of the substrate surface and the stacked structure. A lower connection structure may be formed to fill the gap. The lower connection structure may be electrically connected with the channel and the substrate. The lower connection structure may include a channel connection pattern and a protective pattern.

In a vertical semiconductor device in accordance with example embodiments, a sidewall of the lower connection structure may include a protrusion, and the protrusion may be disposed at a central portion in a vertical direction from an upper surface of the substrate in the sidewall of the lower connection structure. A contact interface portion of the lower connection structure filling a gap between a substrate surface and the stacked structure (e.g., seam) may not be exposed by the sidewall of the lower connection structure.

BRIEF DESCRIPTION OF THE DRAWINGS

Example embodiments will be more clearly understood from the following detailed description taken in conjunction with the accompanying drawings.

FIGS. 1 to 3 are cross-sectional views and a plan view illustrating a vertical semiconductor device in accordance with example embodiments;

FIGS. 4 to 6 are enlarged cross-sectional views illustrating portions of the vertical semiconductor devices in accordance with example embodiments, respectively;

FIGS. 7 to 24 are cross-sectional views and plan views illustrating a method of manufacturing a vertical semiconductor device in accordance with example embodiments;

FIG. 25 is a cross-sectional view illustrating a vertical semiconductor device in accordance with example embodiments;

FIGS. 26 and 27 are cross-sectional views illustrating stages of a method of manufacturing a vertical semiconductor device in accordance with example embodiments;

FIG. 28 is a cross-sectional view illustrating a vertical semiconductor device in accordance with example embodiments;

FIGS. 29 to 33 are enlarged cross-sectional views of portions of vertical semiconductor devices in accordance with example embodiments, respectively;

FIGS. 34 and 35 are cross-sectional views illustrating stages of a method of manufacturing a vertical semiconductor device in accordance with example embodiments; and FIGS. 36 and 37 are a cross-sectional view and a plan view illustrating stages of a method of manufacturing a vertical semiconductor device in accordance with example embodiments.

DESCRIPTION OF EMBODIMENTS

Hereinafter, a direction substantially parallel to an upper surface of the substrate is defined as a first direction. A direction substantially parallel to an upper surface of the substrate and perpendicular to the first direction is defined as a second direction. A direction substantially perpendicular to the upper surface of the substrate is defined as a vertical direction.

Figure 1:
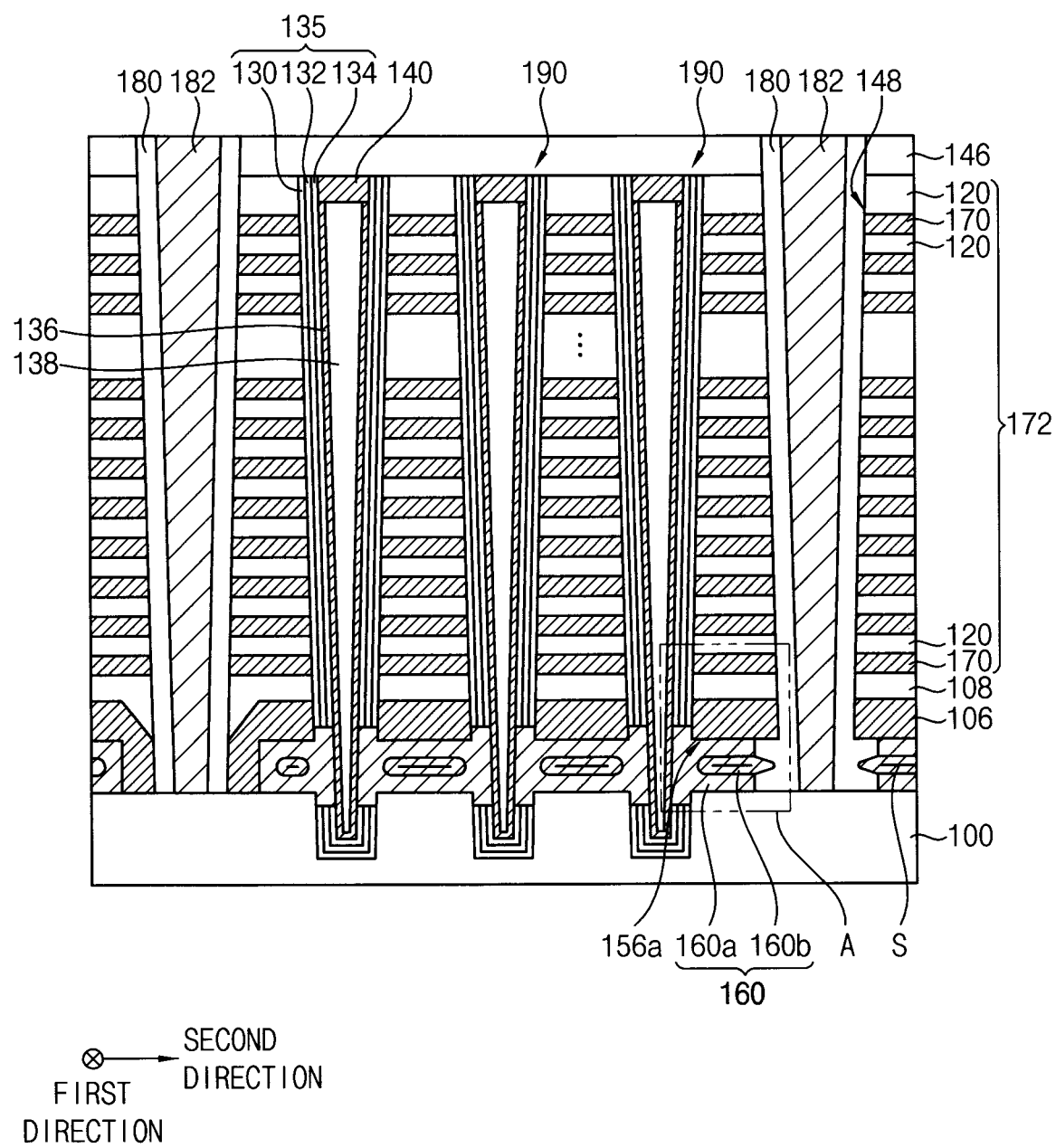
FIGS. 1 to 37 represent non-limiting, example embodiments as described herein.
Figure 2:
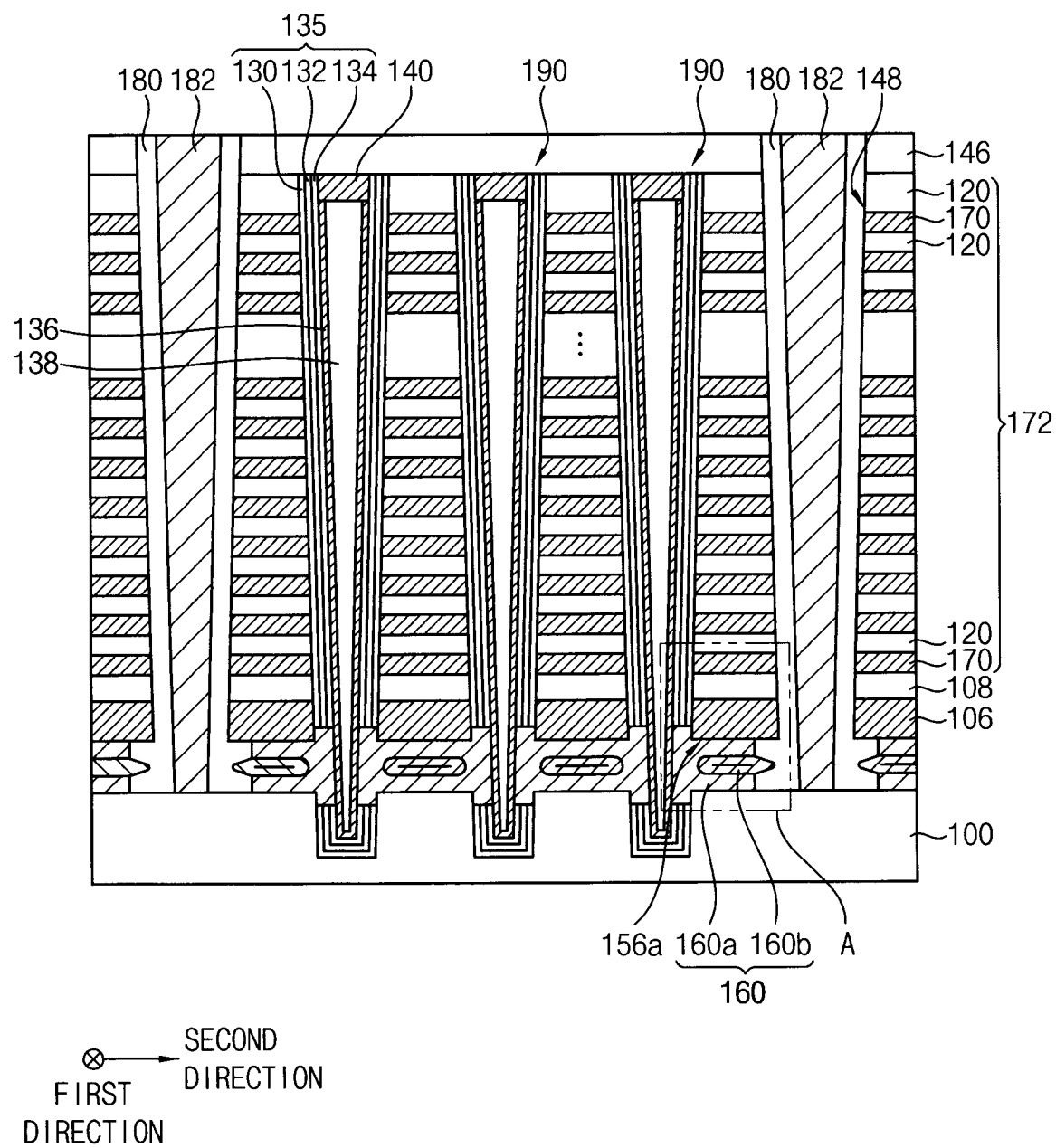
Figure 3:
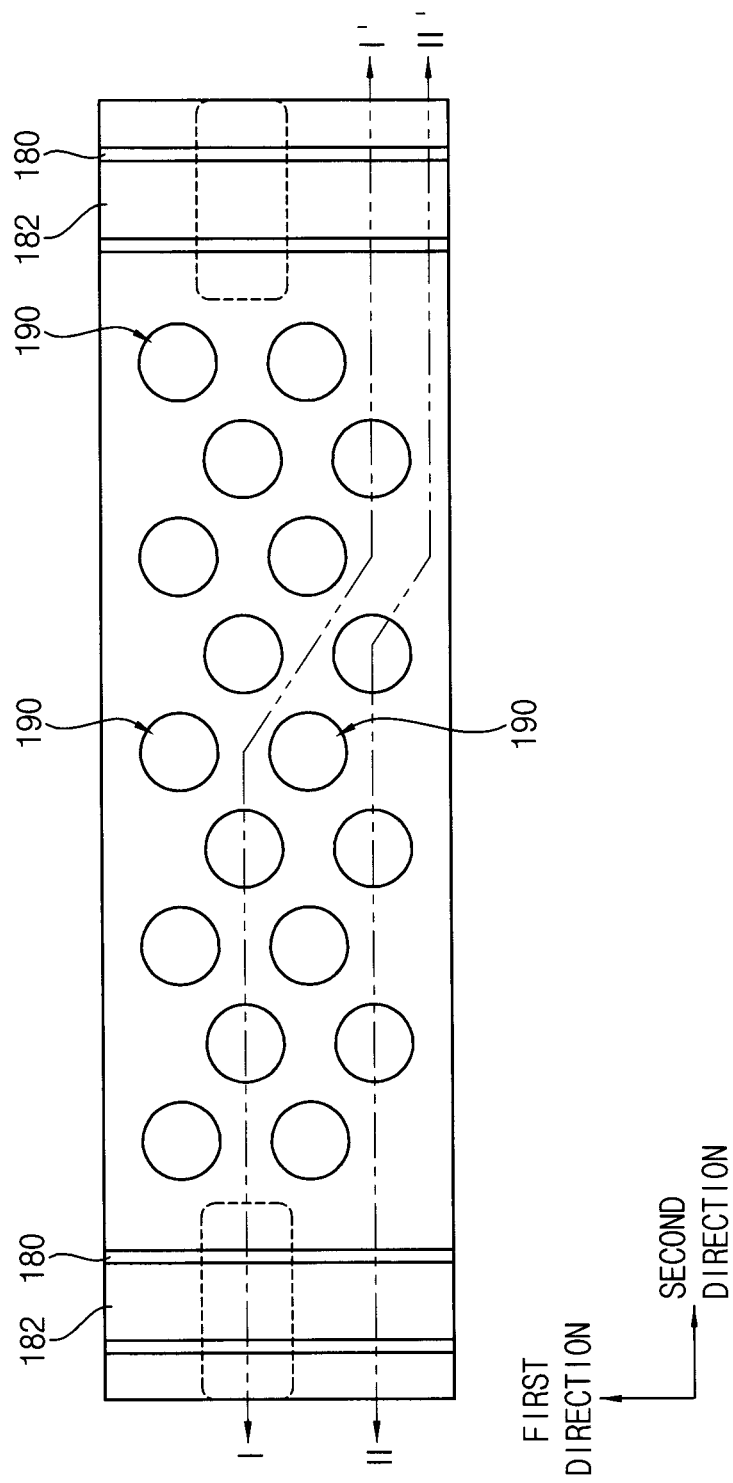
Figure 4:
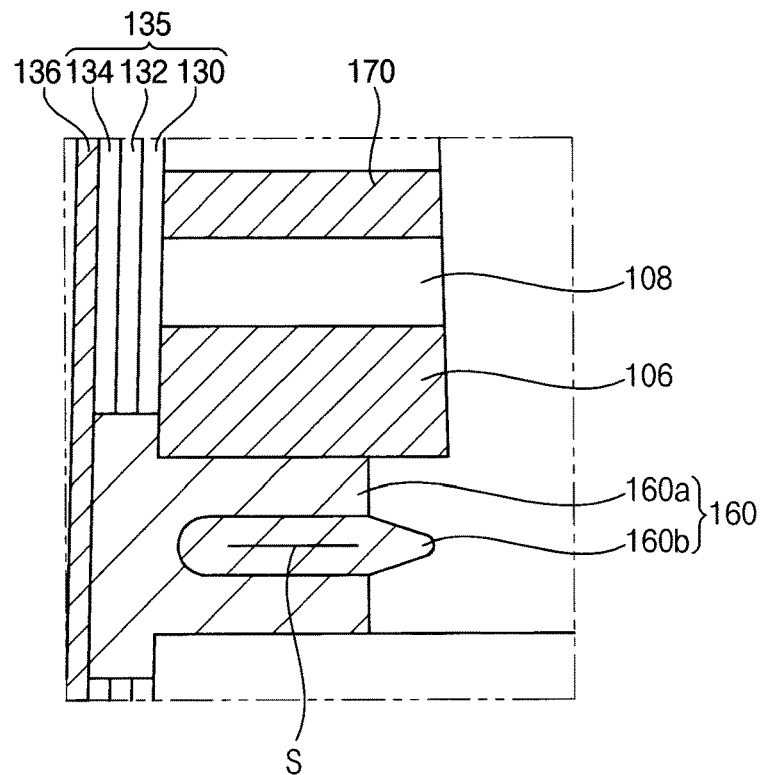
Figure 5:
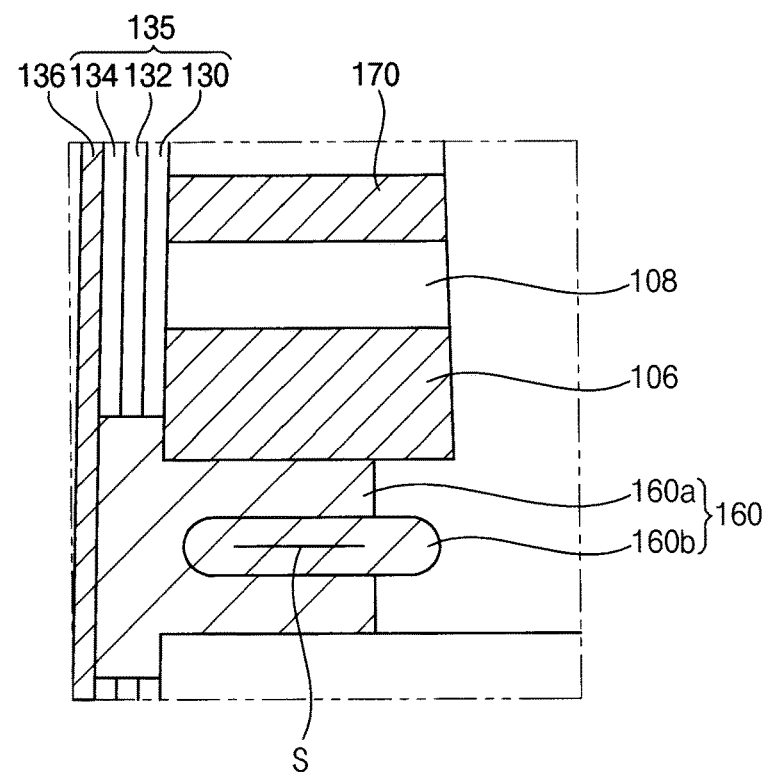
Figure 6:
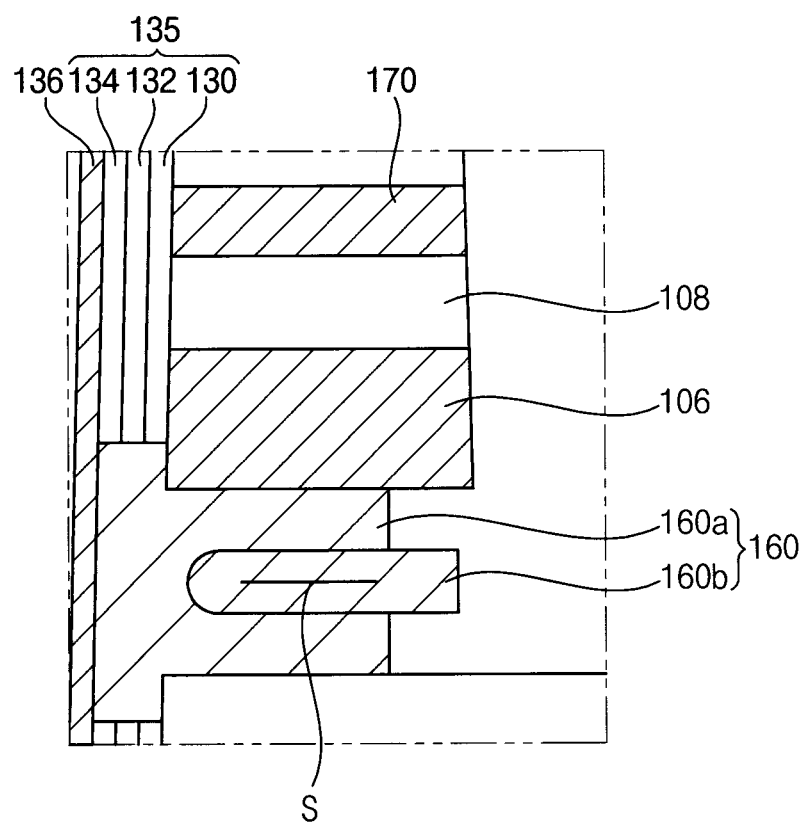

FIGS. 1 to 3 are cross-sectional views and a plan view illustrating a vertical semiconductor device in accordance with example embodiments. FIGS. 4 to 6 are enlarged cross-sectional views illustrating portions of the vertical semiconductor devices in accordance with example embodiments, respectively.

Particularly, FIG. 1 includes a cross-sectional view taken along the path I-I' of FIG. 3. FIG. 2 includes a cross-sectional view taken along the path II-II' of FIG. 3. Each of FIGS. 4 to 6 is an enlarged cross-sectional view illustrating "A" portions of FIGS. 1 and 2.

Referring to FIGS. 1 to 3, the vertical semiconductor device may include a lower connection structure 160, a support layer 106, a stacked structure 172 and a channel structure 190 formed on a substrate 100. The vertical semiconductor device may further include a common source pattern 182 and an insulation spacer 180, etc.

The substrate 100 may include a semiconductor material such as silicon, germanium, or silicon-germanium, or a group III-V compound such as GaP, GaAs, GaSb, or the like. In some example embodiments, the substrate 100 may be a silicon-on-insulator (SOI) substrate or a germanium-on-insulator (GOI) substrate.

The lower connection structure 160 may be electrically connected with the substrate 100 and a channel 136 included in the channel structure 190. Therefore, a bottom of the lower connection structure 160 may directly contact the substrate 100. The lower connection structure 160 will be described in detail later.

The support layer 106 may be formed on the lower connection structure 160. In example embodiments, a portion of the support layer 106 may cover a portion of a sidewall of the lower connection structure 160.

The support layer 106 may support structures formed on the support layer 106 when a first gap (156a, refer to FIG. 15) serving as a space for forming the lower connection structure 160 is formed. The support layer 106 may include, e.g., polysilicon.

A lower insulation layer 108 may be formed on the support layer 106. The lower insulation layer 108 may have a flat upper surface. The lower insulation layer 108 may include silicon oxide.

The stacked structure 172 may be formed on the lower insulation layer 108. The stacked structure 172 may include insulation layers 120 and gate electrodes 170 alternately and repeatedly stacked. One of the insulation layers 120 may be formed on an uppermost portion of the stacked structure 172.

For example, the gate electrodes 170 included in the stacked structure 172 may serve as one of gate electrodes of a ground select transistor, a cell transistor among cell transistors, and a string select transistor.

In example embodiments, the gate electrode 170 may include a barrier layer (not shown) and a gate conductive layer. The gate conductive layer may include a metal having excellent gap filling properties and low resistance. The gate conductive layer may include, e.g., tungsten, titanium, tantalum, platinum, or the like, and the barrier layer may include, e.g., a metal nitride such as tungsten nitride, titanium nitride, tantalum nitride, or the like.

The channel structure 190 may pass through the stacked structure 172, the lower insulation layer 108 and the support layer 106, and the channel structure 190 may extend to an upper portion of the substrate 100. The channel structure 190 may be formed in a channel hole 126 (refer to FIG. 9) extending through the stacked structure 172, the lower insulation layer 108 and the support layer 106 to the upper portion of the substrate 100.

In example embodiments, the channel hole 126 may have a sidewall slope such that a width of the channel hole 126 may be gradually decreased from a top portion to a bottom. Thus, the channel structure 190 may have a sidewall slope such that a width of the channel structure 190 may be gradually decreased from a top portion to a bottom.

The channel structure 190 may include a charge storage structure 135, a channel 136, and a filling pattern 138. The channel structure 190 may further include a capping pattern 140 contacting the channel 136. The capping pattern 140 may be formed in an upper portion of the channel hole 126.

The charge storage structure 135 may include a tunnel insulation pattern 134, a charge storage pattern 132 and a blocking pattern 130 sequentially stacked from an outer wall of the channel 136. The tunnel insulation pattern 134 and the blocking pattern 130 may include silicon oxide, and the charge storage pattern 132 may include silicon nitride.

The charge storage structure 135 may be formed on an upper sidewall of the channel hole 126 positioned higher than a bottom of the support layer 106. In addition, the charge storage structure 135 may partially remain at a lower portion of the channel hole 126 in the substrate 100. That is, the charge storage structure 135 may have a cutting shape at a portion adjacent to the lower connection structure 160.

The channel 136 may have a cylindrical shape in the channel hole 126. The channel 136 may contact the charge storage structure 135 and the lower connection structure 160. The channel 136 may include polysilicon.

The filling pattern 138 may be formed on the channel 136 to fill an inner space of the channel hole 126. The filling pattern 138 may include an insulation material. The insulation material may include, e.g., silicon oxide.

The capping pattern 140 may be formed on the filling pattern 138. The capping pattern 140 may include, e.g., polysilicon. The capping pattern 140 may serve as a pad pattern for contacting upper wirings (not shown).

A first insulating interlayer 146 may be further formed on the capping pattern 140 and the stacked structure 172.

The common source patterns 182 may pass through the first insulating interlayer 146, the stacked structure 172, the support layer 106 and the lower insulation layer 108. A bottom of the common source pattern 182 may contact an upper surface of the substrate 100.

In example embodiments, the common source pattern 182 may have a line shape extending in the first direction. In this case, the common source pattern 182 may be formed in a trench 148 (refer to FIG. 12) passing through the first insulating interlayer 146, the stacked structure 172, the lower insulation layer 108 and the support layer 106 and exposing the substrate 100. The trench 148 may extend in the first direction.

That is, the lower connection structure 160, the support layer 106, the lower insulation layer 108 and the stacked structure 172 may be formed between the common source patterns 182. Thus, the lower connection structure 160, the support layer 106, the lower insulation layer 108 and the stacked structure 172 may have a line shape extending in the first direction.

The common source pattern 182 may include, e.g., a barrier metal layer (not shown) and a metal pattern. The barrier metal layer may include a metal nitride such as tungsten nitride, titanium nitride, tantalum nitride, or the like. Also, the metal pattern may include, e.g., a metal having low electrical resistance such as tungsten, titanium, tantalum, platinum, or the like.

The insulation spacer 180 may be formed on a sidewall of the common source pattern 182. In example embodiments, the insulation spacer 180 may include silicon oxide.

That is, the insulation spacer 180 may be formed on a sidewall of the trench 148.

The stacked structure 172, the lower insulation layer 108, the support layer 106 and the lower connection structure 160 may contact the insulation spacer 180. Thus, the gate electrodes 170 and the common source pattern 182, the support layer 106 and the common source pattern 182, and the lower connection structure 160 and the common source pattern 182 may be insulated from each other by the insulation spacer 180.

As shown in FIG. 1, a portion of a sidewall of the lower connection structure 160 may be covered with the support layer 106. The sidewall of the lower connection structure 160 may not directly contact the insulation spacer 180. FIG. 2 illustrates a portion of a sidewall of the lower connection structure 160 in which the support layer 106 is not formed. In this portion, the sidewall of the lower connection structure 160 may directly contact the insulation spacer 180.

In some example embodiments, the common source pattern 182 may have a shape of a contact plug. In this case, the common source pattern 182 may be formed in a portion of the trench 148 (refer to FIG. 12) extending in the first direction. Although not shown, a common source line may be further formed under the contact plug.

The first gap 156a may be defined by the bottom of the support layer 106, the upper surface of the substrate 100 and the channel 136. The first gap 156a may be in communication with a lower portion of the trench 148. Also, the lower connection structure 160 may be formed in the first gap 156a. The lower connection structure 160 may include a channel connection pattern 160a and a protective pattern 160b.

The channel connection pattern 160a may be conformally formed on the bottom of the support layer 106, a lower sidewall of the channel 136 and the upper surface of the substrate 100. In this case, the channel connection pattern 160a formed on the bottom of the support layer 106 and the channel connection pattern 160a formed on the upper surface of the substrate 100 may not contact to each other at a central portion of the first gap 156a in the vertical direction. Therefore, the channel connection pattern 160a may not include a seam at the central portion.

The channel connection pattern 160a may have conductivity. That is, the channel connection pattern 160a may include a conductive material. Thus, the substrate 100 and the channel 136 may be electrically connected by the channel connection pattern 160a.

In example embodiments, the channel connection pattern 160a may include polysilicon doped with conductive impurities. For example, the channel connection pattern 160a may be doped with N-type impurities such as phosphorous and arsenic.

In some example, the channel connection pattern 160a may be doped with P-type impurities such as, boron.

The protective pattern 160b may be formed on the channel connection pattern 160a. The protective pattern 160b may fill a space between the channel connection pattern 160a formed on the support layer 106 and the channel connection pattern 160a formed on the substrate 100.

The protective pattern 160b may be conformally formed on the surface of the channel connection pattern 160a. That is, the protective pattern 160b formed on the channel connection pattern 160a on the support layer 106 and the protective pattern 160b formed on the channel connection pattern 160a on the substrate 100 may contact to each other at the central portion of the first gap in the vertical direction. Thus, the protective pattern 160b may include a seam S therein. However, the seam S may not be exposed on sidewalls of the lower connection structure 160.

In the lower connection structure 160, an end portion of the protective pattern 160b may protrude from an end portion of the channel connection pattern 160a in a lateral direction toward the trench (i.e., in the second direction). Thus, an end portion of the protective pattern 160b may correspond to a protrusion of the lower connection structure 160.

The protective pattern 160b may include a material having an etching rate lower than that of the channel connection pattern 160a, in an etching process. In example embodiments, in an etching process for forming the channel connection pattern 160a, an etch rate of the channel connection pattern 160a may be higher than twice the etch rate of the protective pattern 160b.

In example embodiments, the protective pattern 160b may include a material that may be etched together with the channel connection pattern 160a with different etching rates, in the same etching process. For example, the channel connection pattern 160a may include polysilicon doped with N-type impurities.

In example embodiments, the protective pattern 160b may include undoped polysilicon or polysilicon doped with P-type impurities. Alternatively, the protective pattern 160b may include polysilicon doped with N-type impurities having a concentration lower than a doped concentration of the channel connection layer.

In some example embodiments, the protective pattern 160b may include polysilicon doped with non-conductive impurities. For example, the non-conductive impurities may include C, O, N, Cl, or the like.

In some example embodiments, the protective pattern 160b may include a material that may be etched in an etching process different from an etching process of the channel connection pattern 160a.

In example embodiments, the protective pattern 160b may include an insulation layer. For example, the protective pattern 160b may include silicon oxide, SiOC, SiON, or the like.

In example embodiments, in the first gap, a thickness of the protective pattern 160b in the vertical direction may be less than a total thickness of the channel connection pattern 160a in the vertical direction.

In example embodiments, a grain size of the protective pattern 160b may be smaller than the grain size of the channel connection pattern 160a.

Thus, the lower connection structure 160 may include the channel connection pattern 160a and the protective pattern 160b interposed between the channel connection pattern 160a.

In the cross-sectional view of a portion of the sidewall of the lower connection structure 160, the channel connection pattern 160a, the protective pattern 160b, and the channel connection pattern 160a may be stacked. Also, the protective pattern 160b may protrude from the channel connection pattern 160a in the second direction. Thus, the end portion of the protective pattern 160b may correspond to the protrusion.

That is, in the sidewall of the lower connection structure 160, an end portion of the lower connection structure 160 disposed at a central portion in the vertical direction may protrude in the second direction from the end portion of the lower connection structure 160 contacting each of the bottom of the support layer 106 and the upper surface of the substrate 100. The sidewall of the lower connection structure 160 may include the protrusion.

In example embodiments, as shown in FIG. 4, upper and lower surfaces of the protective pattern 160b may have a slope, so that the protective pattern 160b have a sharp shape toward the end portion in the second direction. Thus, a height in the vertical direction of the protective pattern 160b may gradually decrease toward the end portion of the protective pattern 160b in the second direction.

In example embodiments, as shown in FIG. 5, the end portion of the protective pattern 160b may have a rounded shape.

In example embodiments, as shown in FIG. 6, upper and lower surfaces of the protective pattern 160b may be flat, and an end portion may have a vertical slope. Thus, the protective pattern 160b may have the same height in the vertical direction according to positions thereof.

In the vertical semiconductor device, the channel connection pattern 160a formed in the first gap 156a may not form a contact interface (i.e., seam) in the first gap 156a. On the other hand, the protective pattern 160b may include the seam S at the central portion of the first gap 156a in the vertical direction. However, the seam S may be disposed at an inner portion of the protective pattern 160b, and may not be exposed by a sidewall of the lower connection structure 160. When excessive etching of the channel connection pattern 160a due to exposure of the seam and filling another material (e.g., conductive material) in the seam and the etched portion is occurred, electrical failures and reliability failures may be generated. However, the seam may not be exposed by the sidewall of the lower connection structure 160, so that electrical failures and reliability failures may be decreased.

FIGS. 7 to 24 are cross-sectional views and plan views illustrating a method of manufacturing a vertical semiconductor device in accordance with example embodiments.

Figure 16:
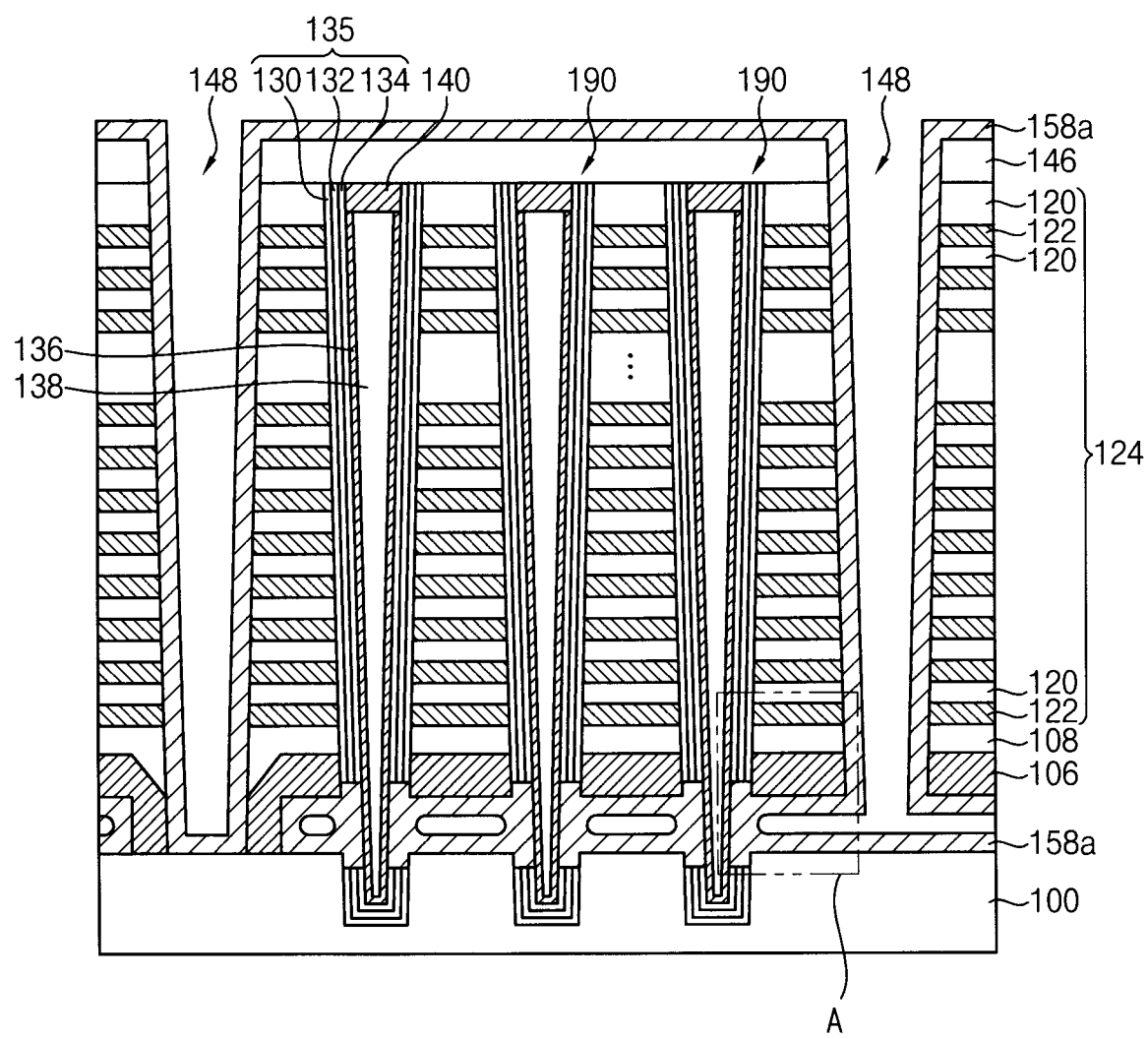
Figure 17:
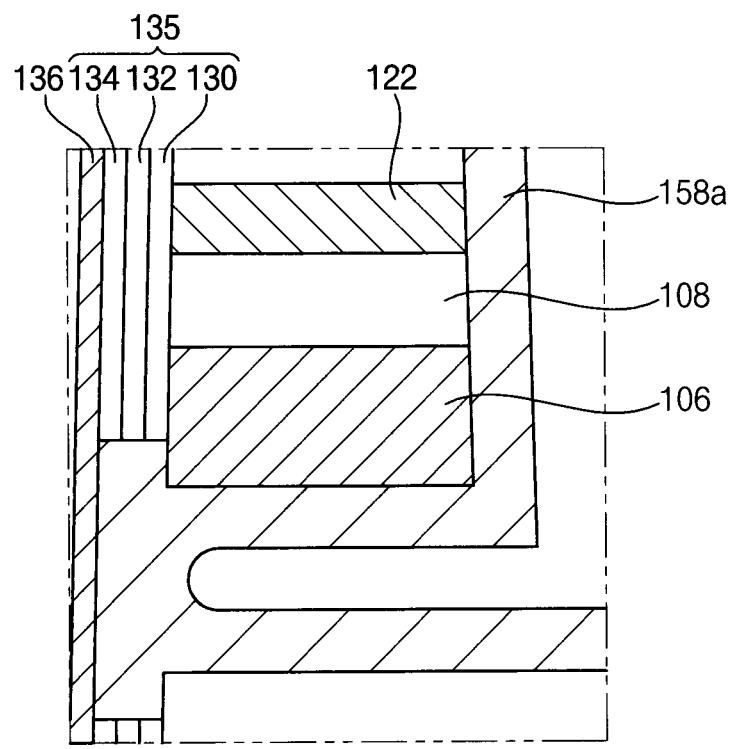

Each of cross-sectional views is taken along the path I-F of FIG. 3. FIG. 17 is an enlarged view of the portion "A" of FIG. 16, and FIG. 19 is an enlarged view of the portion "A" of FIG. 18.

Figure 7:
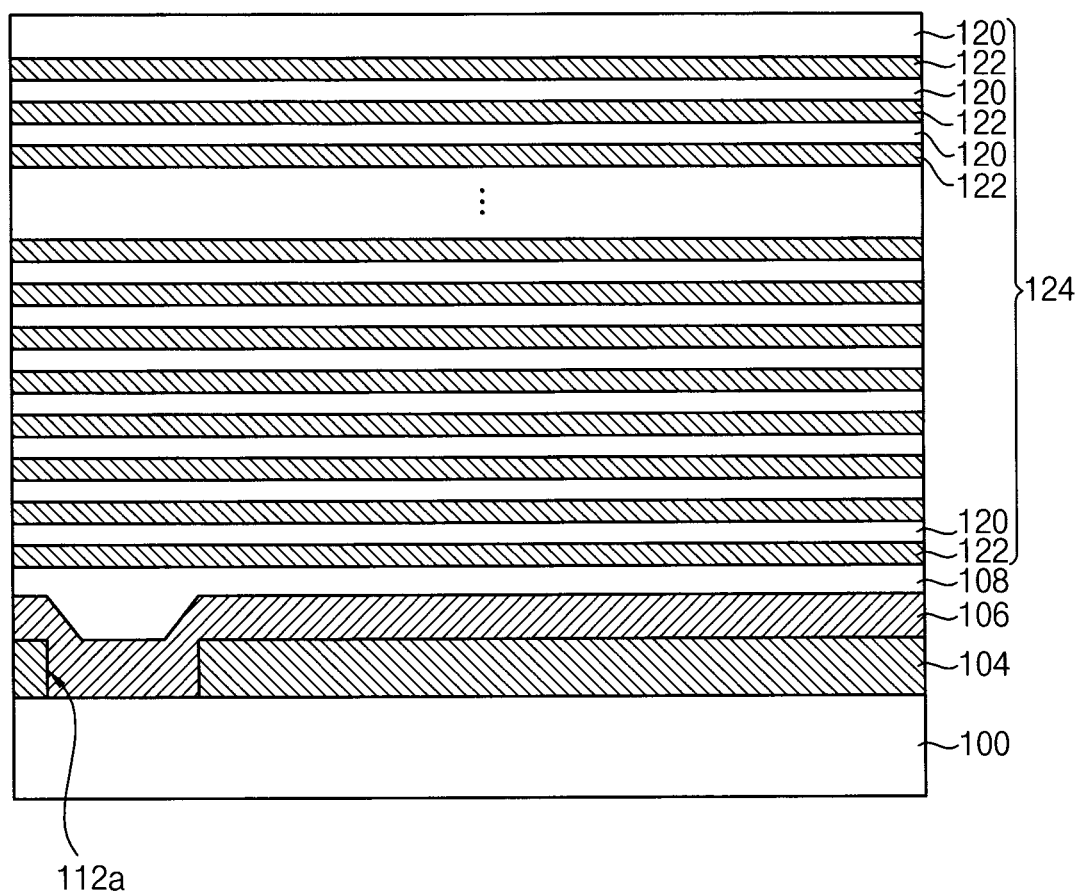
Figure 8:
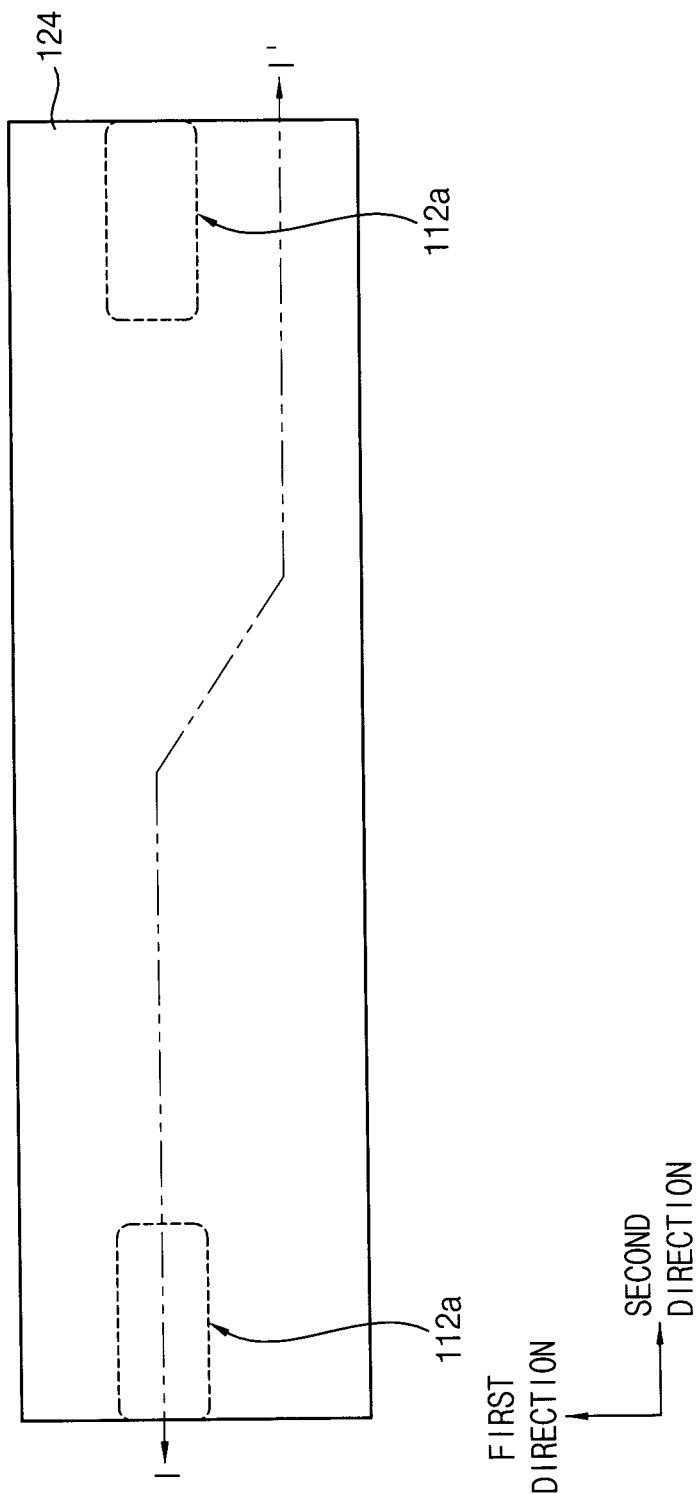

Referring to FIGS. 7 and 8, a first sacrificial pattern 104 may be formed on a substrate 100, and a support layer 106 may be formed on the first sacrificial pattern 104. A lower insulation layer 108 may be formed on the support layer 106. A mold structure 124 may be formed on the lower insulation layer 108.

In example embodiments, a pad layer (not shown) may be further formed on the surface of the substrate 100. For example, the pad layer may include silicon oxide.

The first sacrificial pattern 104 may be formed by forming a first sacrificial layer on the substrate 100 and patterning the first sacrificial layer.

The first sacrificial pattern 104 may include a material having a high etching selectivity with respect to the support layer 106 formed thereon and the insulation layer 120. In example embodiments, the first sacrificial pattern 104 may include a material having a high etching selectivity with respect to silicon oxide and polysilicon. The first sacrificial pattern 104 may include, e.g., silicon nitride.

In example embodiments, in the patterning of the first sacrificial layer, the first sacrificial layer positioned on a portion of the trench for forming the common source pattern 182 may be etched to form the first sacrificial pattern 104 including a first opening 112a. That is, the first opening 112a may be formed in a portion of the trench for forming the common source pattern 182. A surface of the substrate 100 may be exposed by a bottom of the first opening 112a.

In some example embodiments, the patterning process may not be performed, after forming the first sacrificial layer. Thus, the first sacrificial layer may not include the first opening 112a. In this case, subsequent same processes may be performed to form a semiconductor device to have a cross-sectional view as shown in FIG. 2.

In example embodiments, the support layer 106 may be formed on an upper surface of the first sacrificial pattern 104 to fill the first opening 112a. Thus, the support layer 106 may contact the surface of the substrate 100 and a portion of a sidewall of the first sacrificial pattern 104.

When the first sacrificial pattern 104 is removed by subsequent process, the support layer 106 may support the lower insulation layer 108 and the mold structures 124 thereon. In example embodiments, the support layer 106 may include, e.g., polysilicon.

The lower insulation layer 108 may be formed on the support layer 106. The lower insulation layer 108 may be formed to have a flat upper surface. The lower insulation layer 108 may include silicon oxide.

Second sacrificial layers 122 and insulation layers 120 may be alternately and repeatedly formed on the lower insulation layer 108 to form the mold structure 124. One of the insulation layers 120 may be formed on an uppermost portion of the mold structure 124.

In example embodiments, the lower insulation layer 108 and the insulation layer 120 may include an oxide, e.g., silicon oxide, and the second sacrificial layer 122 may include, e.g., silicon nitride.

Figure 9:
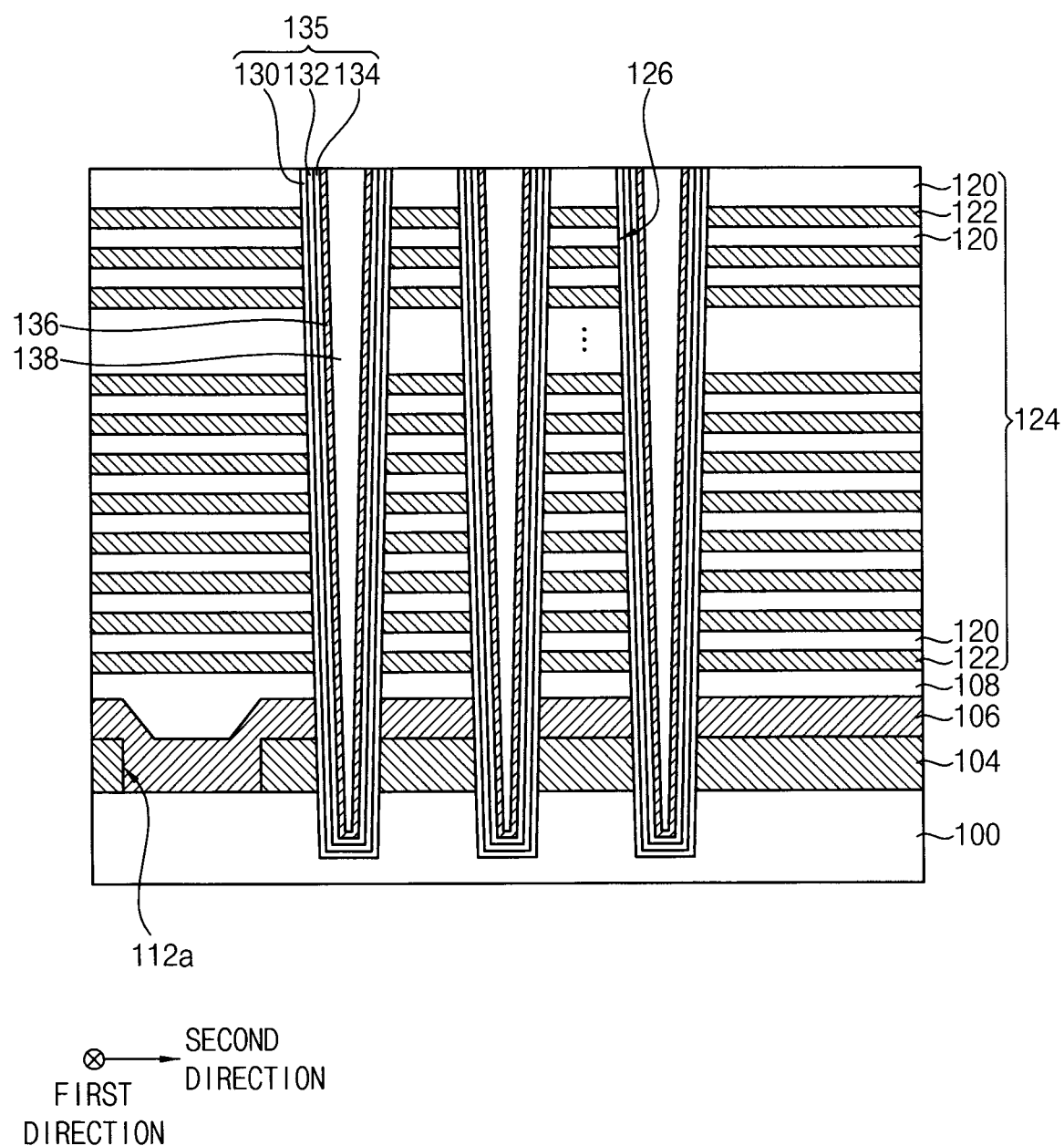

Referring to FIG. 9, the insulation layers 120, the second sacrificial layers 122, the lower insulation layer 108, the support layer 106 and the first sacrificial pattern 104 may be etched by an anisotropic etching process to form channel holes 126 exposing the surface of the substrate 100. In example embodiments, the channel holes 126 may extend to a portion under an upper surface of the substrate 100.

A charge storage structure 135, a channel 136 and a filling pattern 138 may be formed in each of the channel holes 126.

Particularly, a charge storage structure layer may be formed on sidewalls and bottoms of the channel holes 126 and an upper surface of the mold structure 124. The charge storage structure layer may include a blocking layer, a charge storage layer and a tunnel insulation layer sequentially stacked. For example, the blocking layer, the charge storage layer and the tunnel insulation layer may include silicon oxide, silicon nitride and silicon oxide, respectively.

A channel layer may be conformally formed on the charge storage structure layer. The channel layer may include polysilicon.

Thereafter, a filling insulation layer may be formed on the channel layer to fill a remaining portion of the channel holes 126. Then, the filling insulation layer, the channel layer, and the charge storage may be planarized until an upper surface of the mold structure 124 may be exposed.

By the planarization process, the charge storage structure 135 and the channel 136 may be sequentially stacked on the sidewalls of the channel holes 126 and the upper surface of the substrate 100. The filling pattern 138 may be formed on the channel 136 to fill an inner portion of the channel 136. The charge storage structure 135 may include a blocking pattern 130, a charge storage pattern 132 and a tunnel insulation pattern 134.

Figure 10:
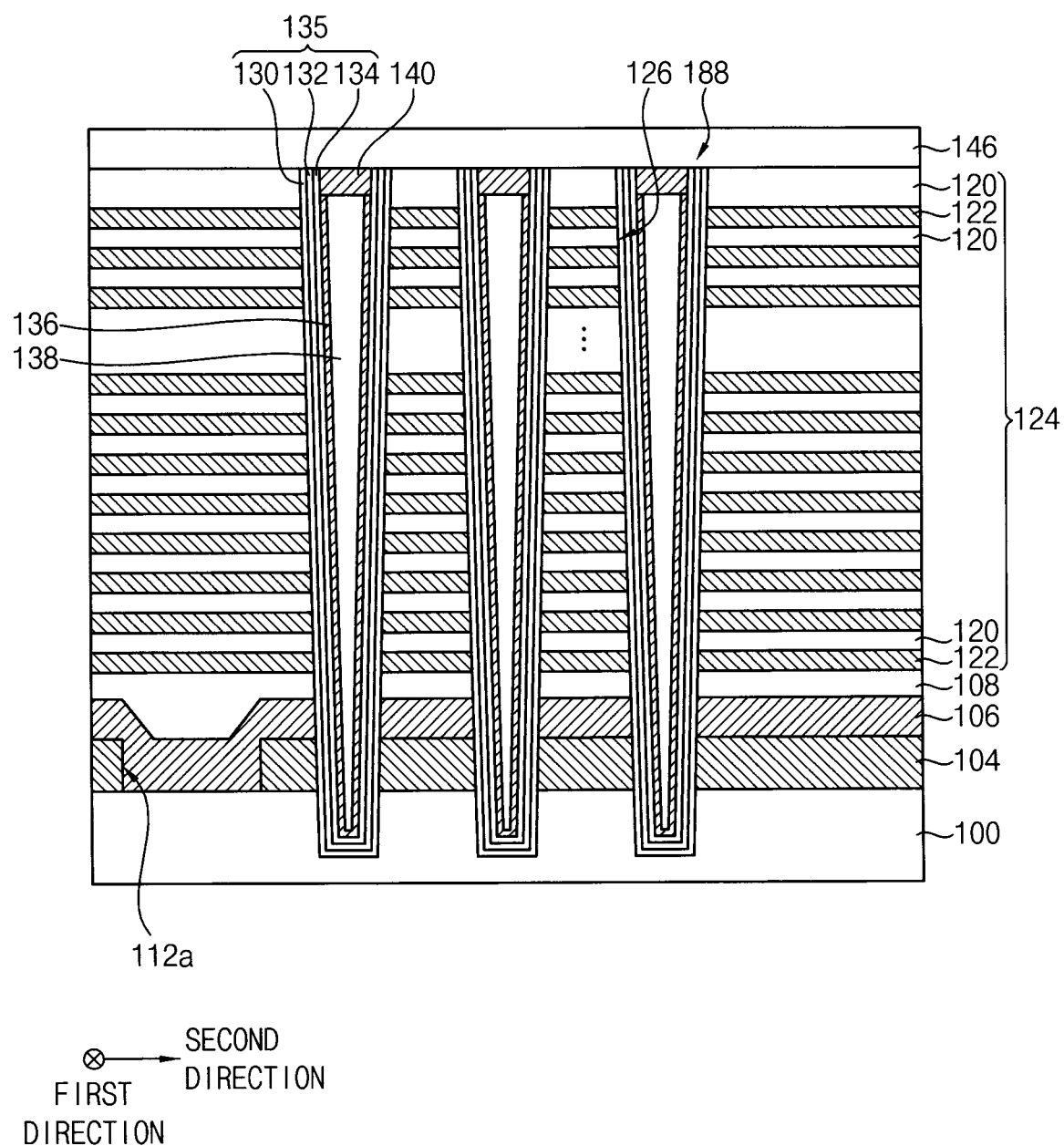
Figure 11:
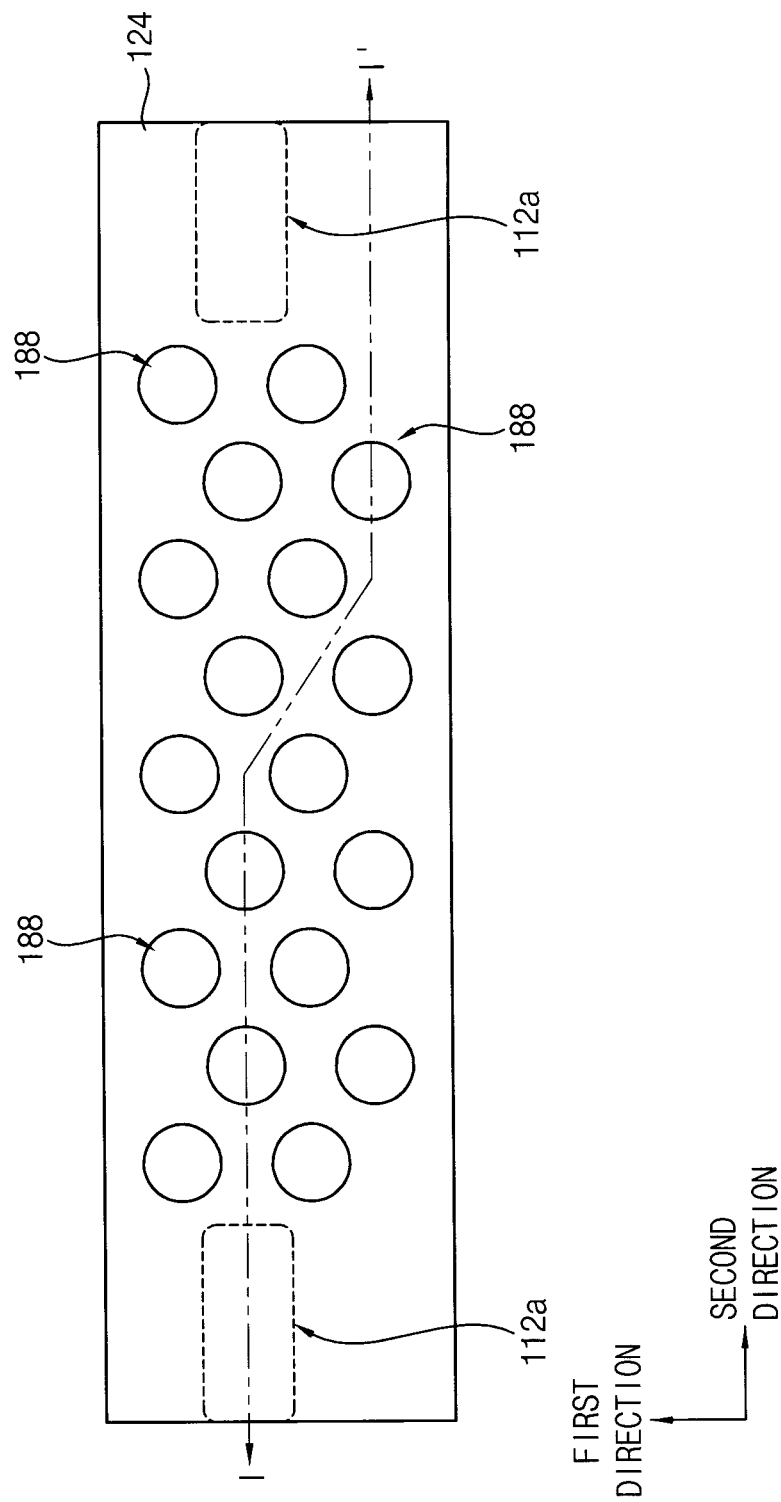

Referring to FIGS. 10 and 11, upper portions of the filling pattern 138 and the channel 136 may be removed to form a recess, and a capping pattern 140 may be formed in the recess. The capping pattern 140 may include, e.g., polysilicon. Thus, a preliminary channel structure 188 may be formed in each of the channel holes 126. Thereafter, a first insulating interlayer 146 may be formed on the mold structure 124 and the capping pattern 140.

Figure 12:
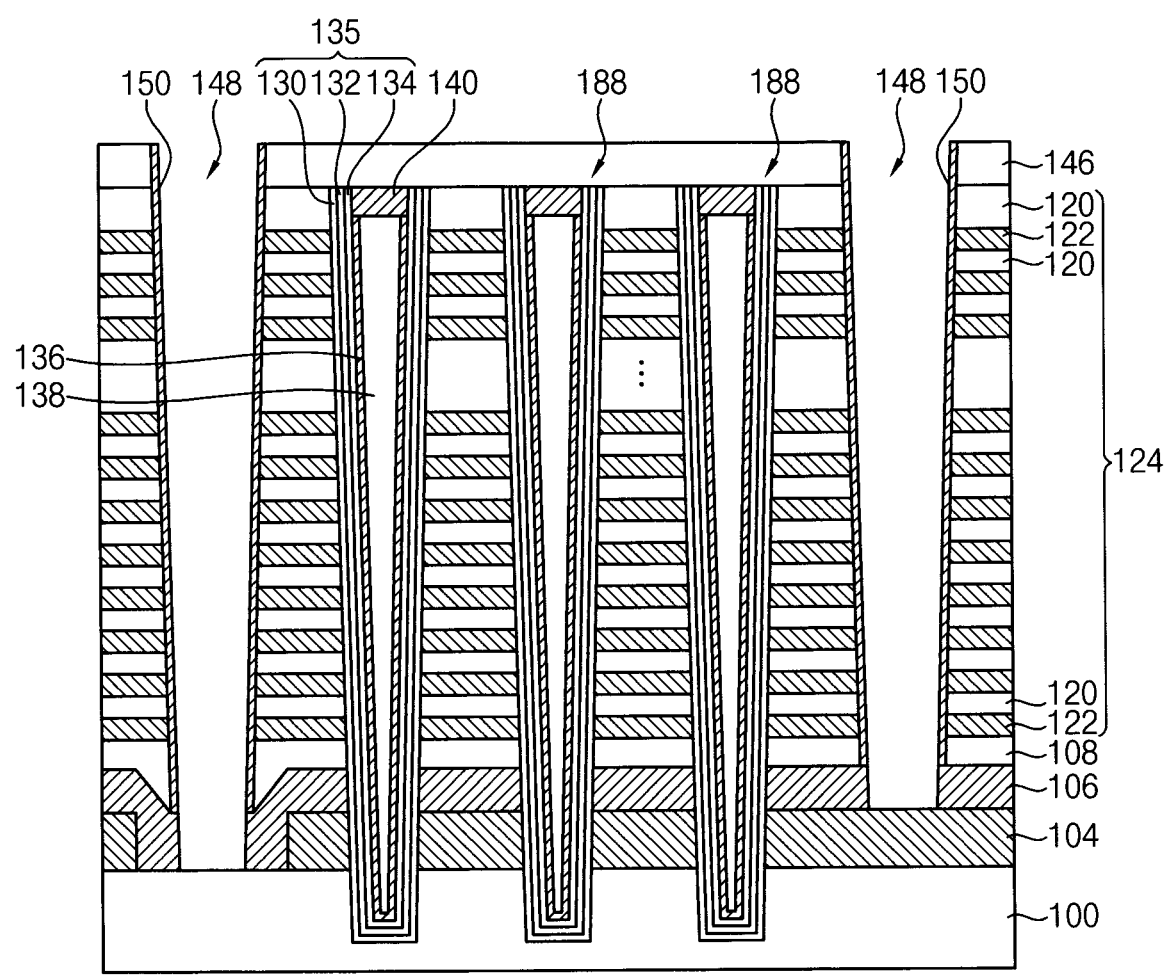
Figure 13:
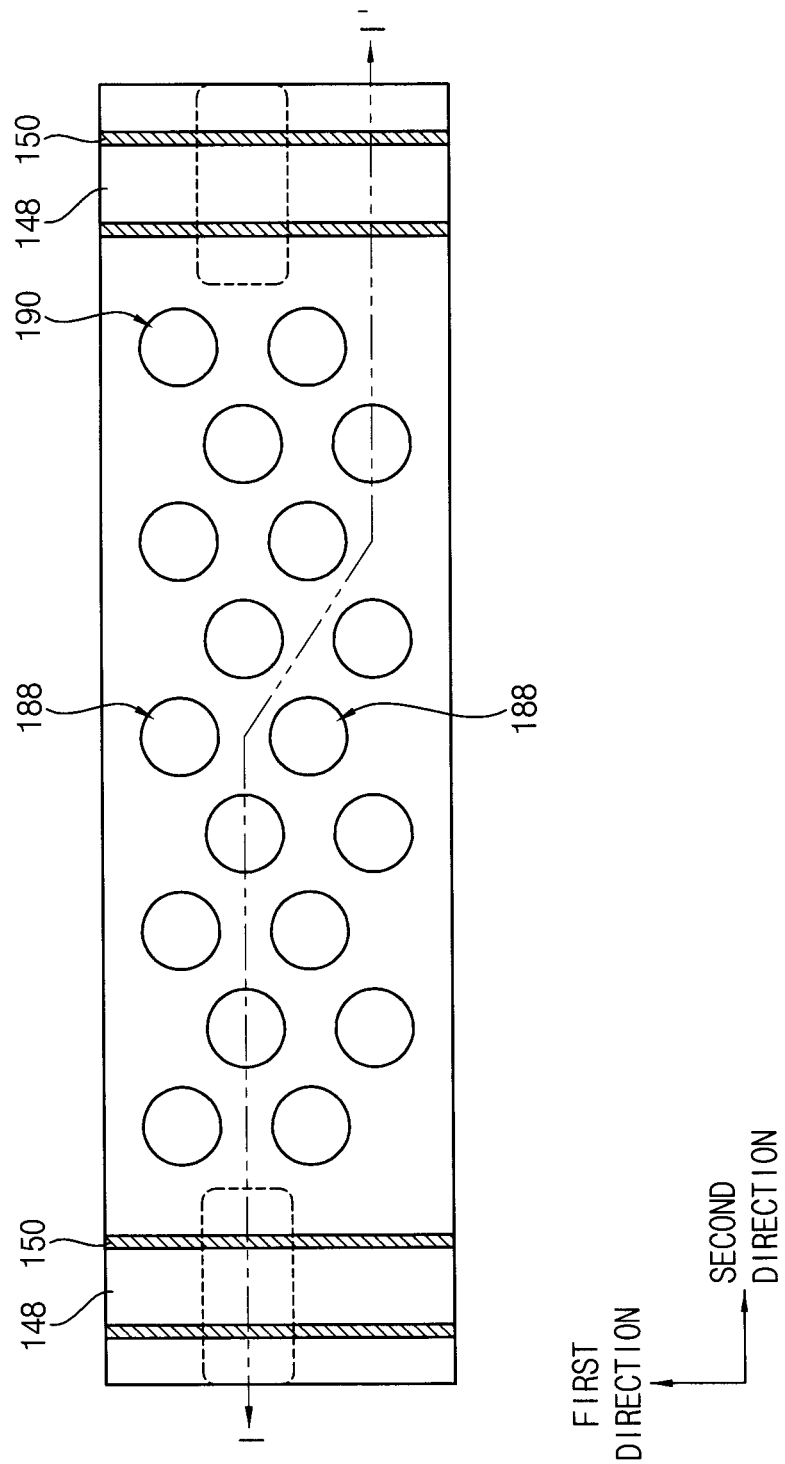

Referring to FIGS. 12 and 13, the first insulating interlayer 146, the second sacrificial layers 122, the insulation layers 120 and the lower insulation layer 108 may be etched by an anisotropic etching process to form a preliminary trench exposing an upper surface of the support layer. The preliminary trench may extend in the first direction. The preliminary trench may have a first width in the second direction. In example embodiments, the first width may be greater than a thickness of the first sacrificial pattern 104 formed on the substrate 100.

A first spacer layer may be formed on a sidewall and a bottom of the preliminary trench and the first insulating interlayer 146. The first spacer layer may be anisotropically etched to form the first spacer 150. The first spacer 150 may be formed on the sidewall of the preliminary trench. In example embodiments, the first spacer 150 may include polysilicon.

Subsequently, the support layer 106 exposed by the bottom of the preliminary trench may be anisotropically etched to form a trench 148. The first sacrificial pattern 104 may be exposed by the bottom of the trench 148.

The first spacer 150 may cover sidewalls of the lower insulation layer 108 and the mold structure 124 exposed by the trench 148. Therefore, the insulation layer 120, the second sacrificial layers 122 and the lower insulation layer 108 may not be exposed by the trench 148.

Figure 14:
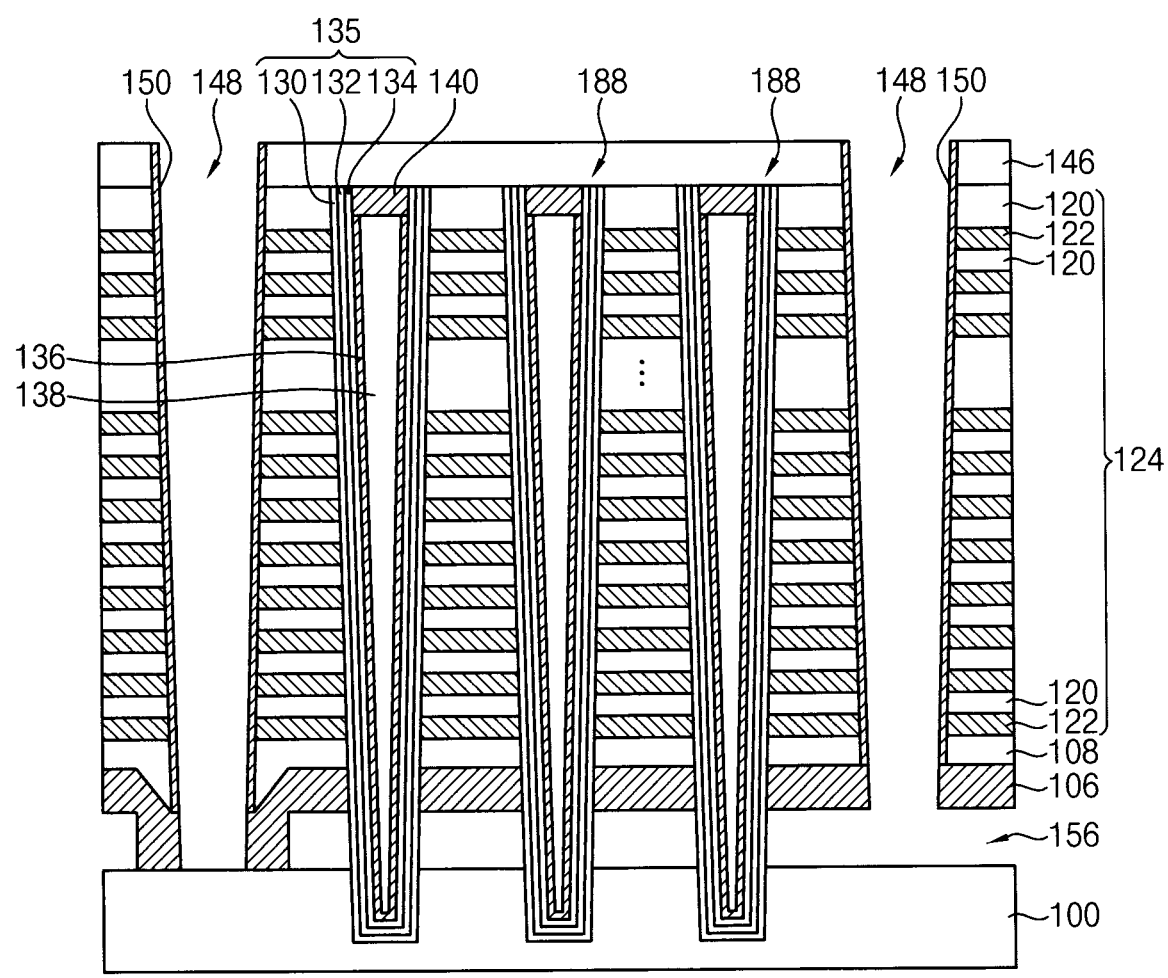

Referring to FIG. 14, the preliminary first gap 156 may be formed by removing the first sacrificial pattern 104 exposed by the bottom of the trench 148. The removing process may include an isotropic etching process, e.g., a wet etching process.

In the removing process of the first sacrificial pattern 104, other layers except for the first sacrificial pattern 104, e.g., oxide, polysilicon, or the like may not be removed. The bottom of the support layer 106 and a portion of sidewall of the blocking pattern 130 may be exposed by the preliminary first gap 156.

Figure 15:
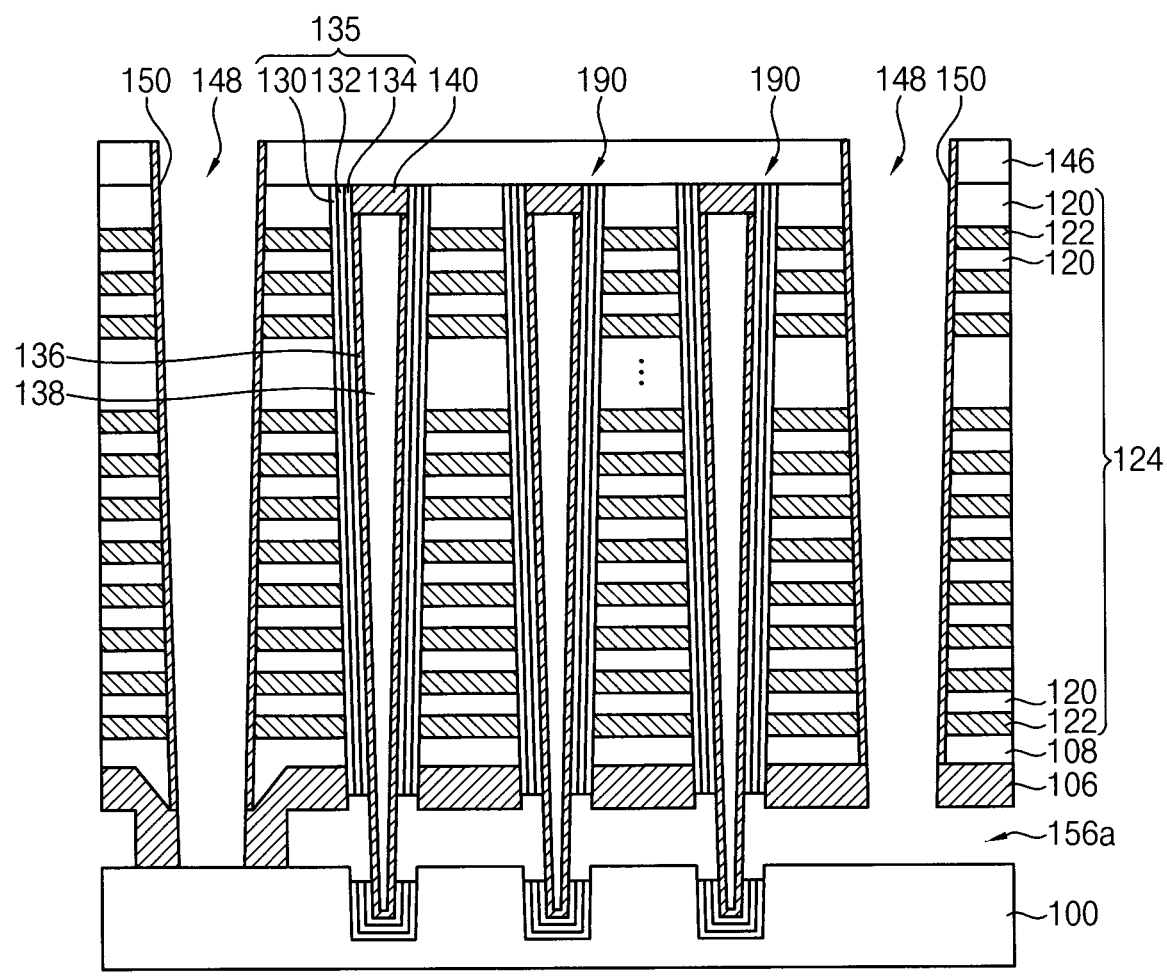

Referring to FIG. 15, the blocking pattern 130, the charge storage pattern 132, and the tunnel insulation pattern 134 exposed by the preliminary first gap 156 may be sequentially removed. Thus, the preliminary first gap 156 may be transformed to a first gap 156a. Also, the preliminary channel structure 188 may be transformed to a channel structure 190.

The first gap 156a and the trench 148 may be in communication with each other.

A lower outer wall of the channel 136 may be exposed by the first gap 156a. Also, the upper surface of the substrate 100 may be exposed by the first gap 156a.

In example embodiments, a pad layer may be formed on the substrate 100. In this case, the pad layer may be removed together by the etching process of the blocking pattern 130 and the tunnel insulation pattern 134 exposed by the preliminary first gap 156.

When the wet etching process is performed, a portion of the charge storage structure 135 directly exposed by the preliminary first gap 156 may be etched, and the charge storage structure 135 may be further etched in the vertical direction from the preliminary first gap 156.

In the first gap 156a, a portion between the upper surface of the substrate 100 and the bottom of the support layer 106 is referred to as a first portion, and an etched portion of the charge storage structure 135 is referred to as a second portion. For example, a second height in the vertical direction of the second portion may be greater than a first height in the vertical direction of the first portion. The first height may be substantially the same as a thickness of the first sacrificial pattern 104, so that the first height may be less than the first width.

Referring to FIGS. 16 and 17, the first spacer 150 (refer to FIG. 15) formed on the sidewall of the trench 148 may be removed. The removing process of the first spacer 150 may include an isotropic etching process.

Thereafter, a channel connection layer 158a may be conformally formed on the sidewall of the trench 148, a surface of the first gap 156a (refer to FIG. 15), the substrate 100 and an upper surface of the first insulating interlayer 146.

The channel connection layer 158a may be formed so as not to completely fill the first portion of the first gap 156a. That is, in the first gap 156a, the channel connection layer 158a formed on the bottom of the support layer 106 and the channel connection layer 158a formed on the substrate 100 may not contact each other at a central portion of the first gap 156a in the vertical direction. Thus, the channel connection layer 158a may not include a contact interface in the first gap 156a. Also, the channel connection layer 158a may be formed so as not to completely fill in the trench 148.

The channel connection layer 158a may be formed to completely fill the second portion of the first gap 156a.

That is, the channel connection layer 158a may be formed to have a first thickness less than ½ of the first height. Also, the first thickness may be greater than ½ of a width in the second direction of the charge storage structure.

The channel connection layer 158a may fill the second portion, so that the channel 136 may be electrically connected to the substrate 100 by the channel connection layer 158a.

In example embodiments, the channel connection layer 158a may include polysilicon doped with conductive impurities. For example, the channel connection layer 158a may be doped with N-type impurities such as phosphorous and arsenic.

In some example embodiments, the channel connection layer 158a may be doped with P-type impurities such as boron.

Figure 18:
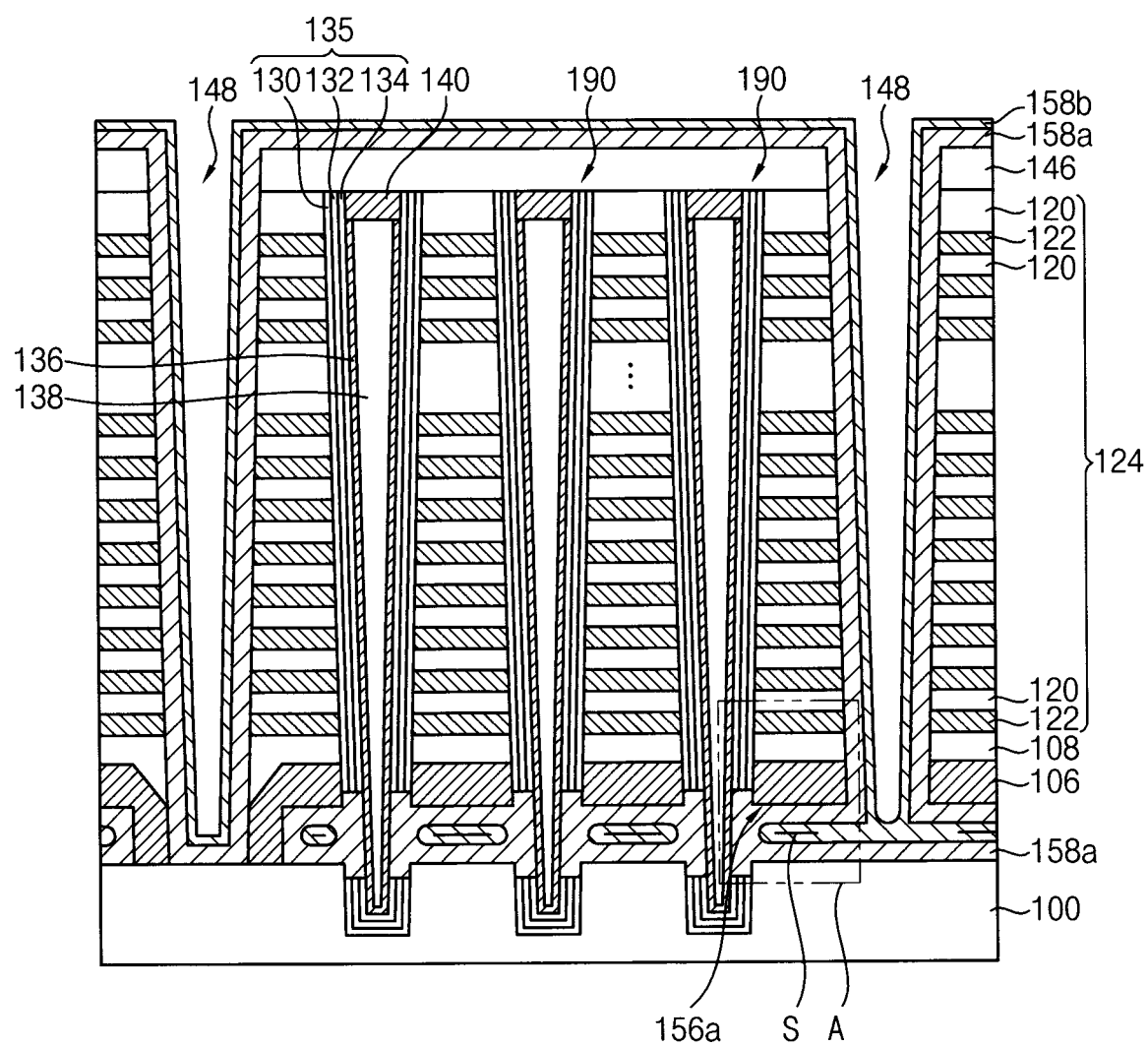
Figure 19:
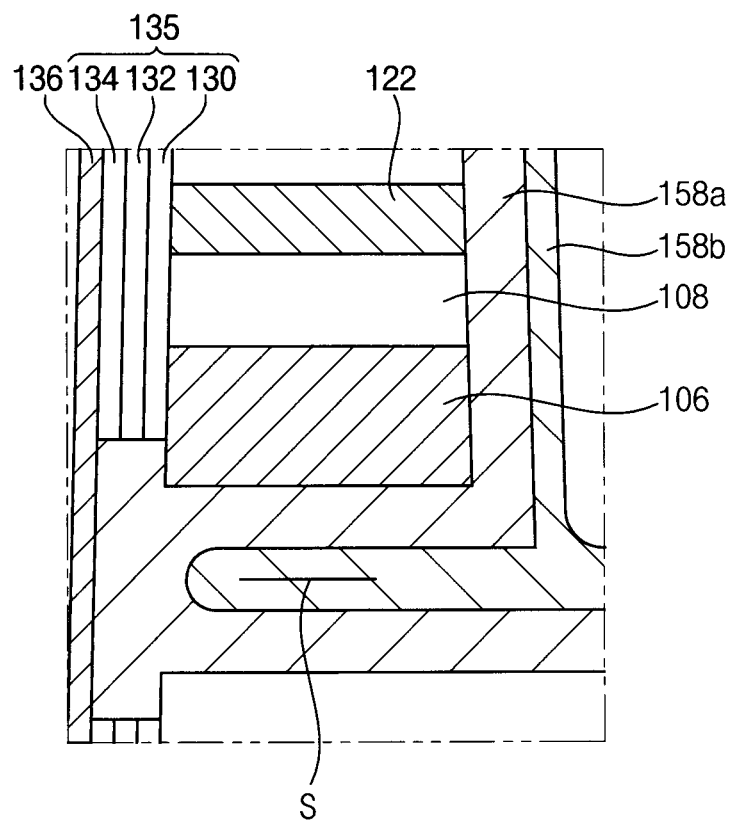

Referring to FIGS. 18 and 19, a protective layer 158b may be conformally formed on the channel connection layer 158a.

The protective layer 158b may be formed to completely fill the first portion of the first gap 156a. Also, the protective layer 158b may be formed so as not to completely fill in the trench 148.

That is, the protective layer 158b conformally formed on an upper surface of the channel connection layer 158a may contact itself at the central portion of the first gap 156a in the vertical direction. Thus, the first portion may be completely filled by the protective layer 158b. In addition, a seam S may be formed at a contact portion of the protective layer 158b. The protective layer 158b may be deposited on the bottom of the trench 148, so that an inlet portion of the first gap 156a may be filled by the protective layer 158b. Thus, the seam S may be positioned at an inner portion of the protective layer 158b at the central portion of the first gap 156a in the vertical direction.

That is, the protective layer 158b may be formed to have a thickness greater than ½ of a height of a gap in the vertical direction between the channel connection layers 158a formed at the first portion. Also, the protective layer 158b may be formed to have the thickness less than ½ of a width in the second direction between the channel connection layers 158a formed on facing sidewalls of the trench 148.

In example embodiments, in the etching process of the channel connection layer 158a, the protective layer 158b may use a material having an etching rate lower than that of the channel connection layer 158a. For example, in the process of etching the channel connection layer 158a, the etching rate of the channel connection layer 158a may be higher than twice the etching rate of the protective layer 158b.

In example embodiments, the channel connection layer 158a and the protective layer 158b may include materials, respectively, having different etching rates in the same etching process.

For example, the channel connection layer 158a may include polysilicon doped with N-type impurities.

In example embodiments, the protective layer 158b may include undoped polysilicon. Alternatively, the protective layer 158b may include polysilicon doped with N-type impurities having a concentration lower than a doped concentration of the channel connection layer. In the etching process, the undoped polysilicon or the polysilicon lightly doped with N-type impurities may have an etching rate lower than that of the polysilicon doped with N-type impurities of the channel connection layer.

In some example embodiments, the protective layer 158b may include polysilicon doped with P-type impurities. In the etching process, polysilicons doped with impurities having different conductivity types may have different etching rates to each other.

In some example embodiments, the protective layer 158b may include polysilicon doped with non-conductive impurities. For example, the non-conductive impurities may include C, O, N, Cl or the like. In the etching process, polysilicon doped with conductive impurities and polysilicon doped with non-conductive impurities may have different etching rates to each other.

In some example embodiments, the channel connection layer 158a and the protective layer 158b may include materials, respectively, of which may be etched by different etching processes. When the channel connection layer 158a is etched, the protective layer 158b may be etched less than is the channel connection layer 158a. In example embodiments, the protective layer 158b may include an insulation layer. For example, the protective layer 158b may include silicon oxide, SiOC, SiON, or the like.

Figure 20:
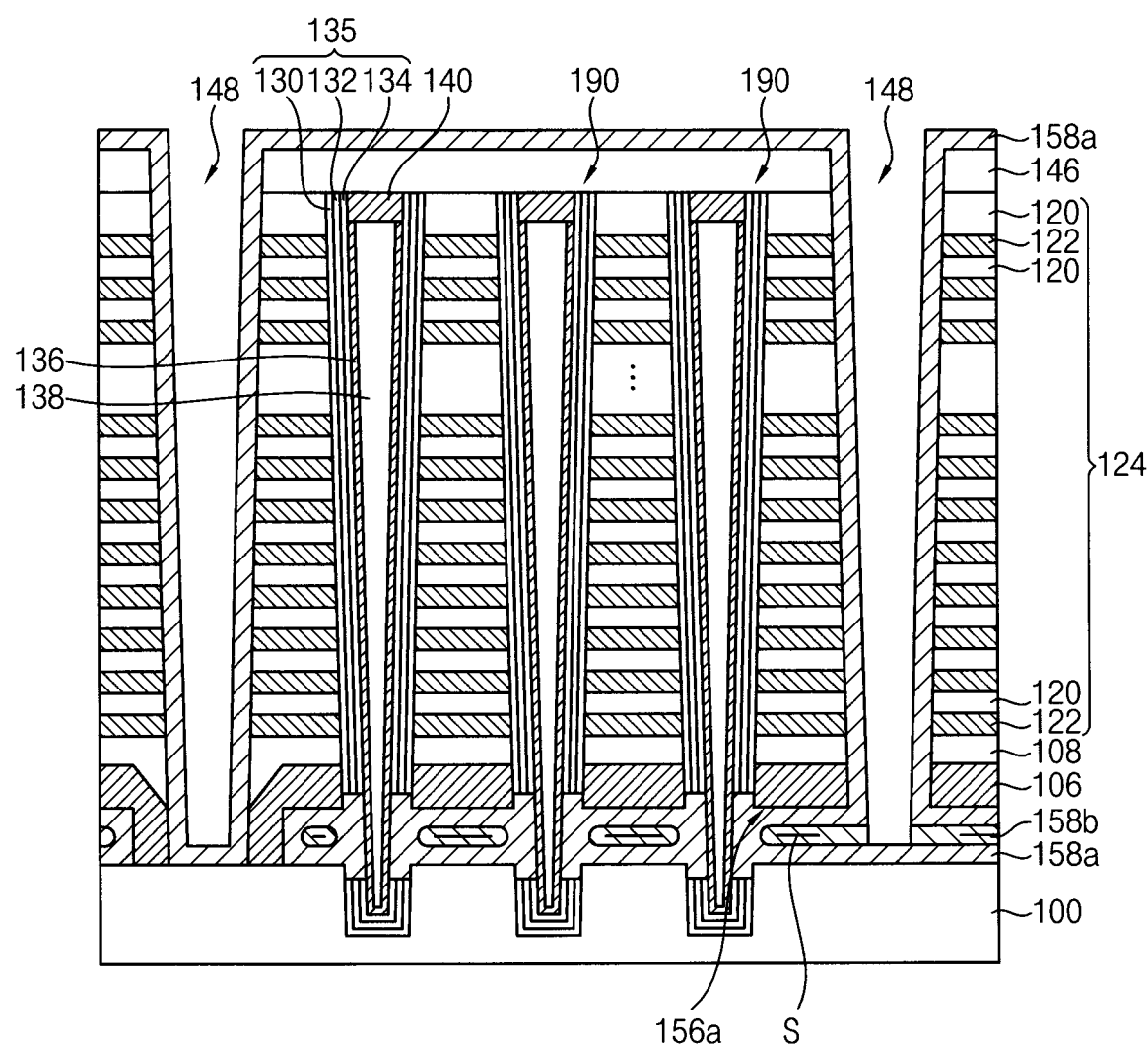
Figure 21:
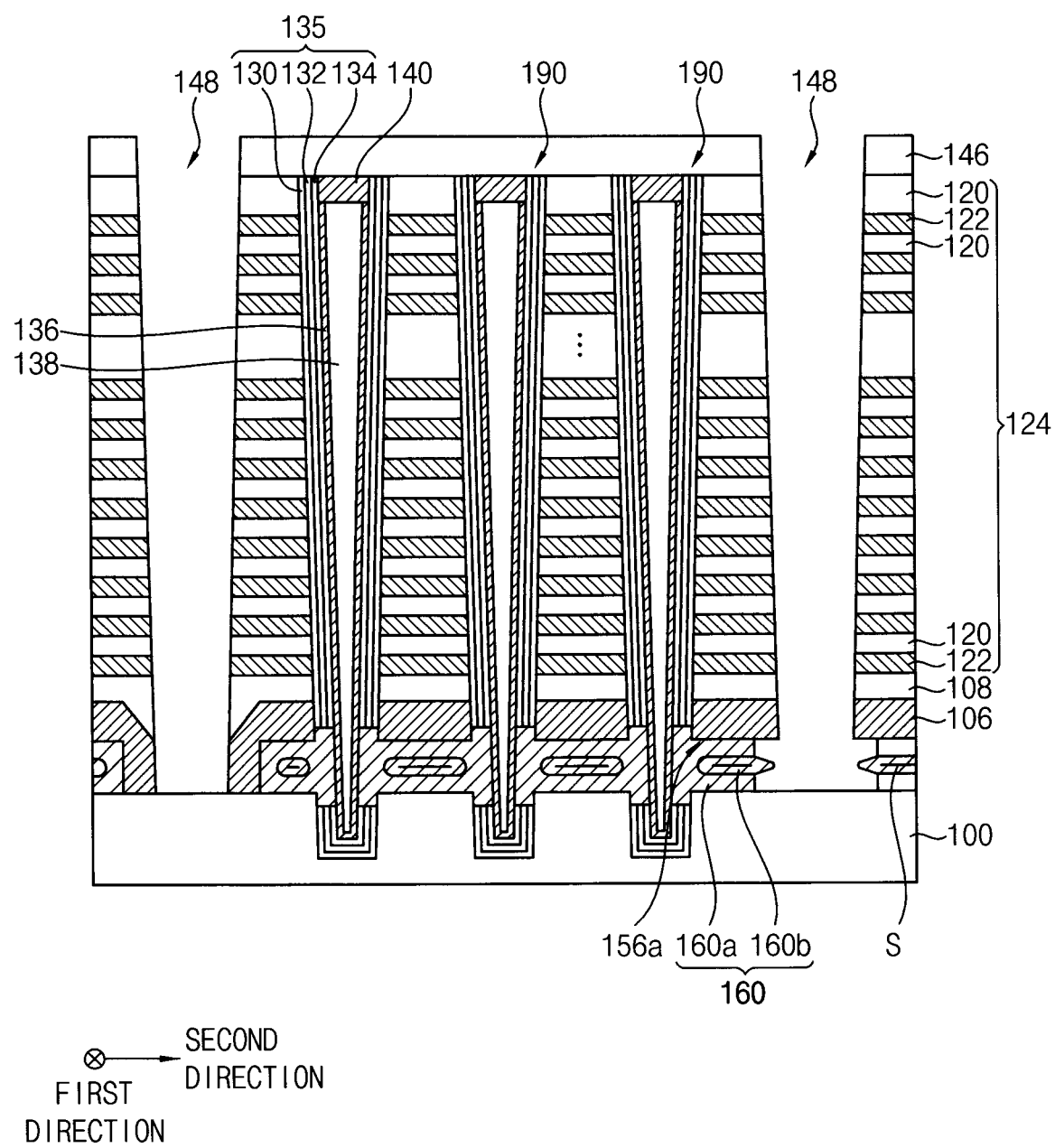

Referring to FIGS. 20 and 21, the protective layer 158b and the channel connection layer 158a formed on the sidewall and the bottom of the trench 148 and the first insulating interlayer 146 may be sequentially removed to form the lower connection structure 160 filling the first gap 156a. The lower connection structure 160 may include a channel connection pattern 160a and a protective pattern 160b. Also, the substrate 100 may be exposed by the bottom of the trench 148.

First, as shown in FIG. 20, the protective layer 158b formed on the sidewall and the bottom of the trench 148 and the first insulating interlayer 146 may be removed. In this case, the protective layer 158b may remain in the first gap 156a. In example embodiments, the protective layer 158b may be removed by an isotropic etching process. The isotropic etching process may include an isotropic dry etching process.

In the etching process, the protective layer 158b has a relatively low etching rate, so that amount of etching may be easily controlled. In the etching process, the seam positioned in the protective layer 158b may not be exposed.

Thereafter, as shown in FIG. 21, the channel connection layer 158a (refer to FIG. 20) formed on the sidewall and the bottom of the trench 148 and the first insulating interlayer 146 may be removed. Thus, the insulation layer 120 and the second sacrificial layer 122 may be exposed by the sidewall of the trench 148. The channel connection layer 158a may be removed by an isotropic etching process. The isotropic etching process may include an isotropic dry etching process.

In the removing process of the channel connection layer 158a, the protective layer 158b may be slightly etched or may be etched to have the etching rate lower than that of the channel connection layer 158a. That is, the channel connection layer 158a formed at the first portion of the first gap 156a may be etched faster than the protective layer 158b.

By the above process, a lower connection structure 160 may be formed in the first gap 156a, and the lower connection structure 160 may include the channel connection pattern 160a and the protective pattern 160b interposed between portions of the channel connection pattern 160a. In this case, in the cross-sectional view of a portion of the sidewall of the lower connection structure 160, the channel connection pattern 160a, the protective pattern 160b and the channel connection pattern 160a may be stacked. Also, the protective pattern 160b may protrude from the channel connection pattern 160a in the second direction.

In addition, after performing the etching process, the seam S included in the protective pattern 160b may not be exposed by the sidewall of the lower connection structure 160. Therefore, defects due to an exposure of the seam S may decrease.

In example embodiments, the etching process of the channel connection layer 158a may use a gas such as HBr, Cl$_2$, F$_2$, HCl, ClF$_3$, or the like.

According to the etching process, a shape of the sidewall of the lower connection structure 160 may be changed. For example, the sidewall of the lower connection structure 160 may have one of shapes as shown in FIGS. 4, 5, and 6.

When the channel connection layer 158a is etched, the protective layer 158b may be partially etched to form the lower connection structure 160 having one of shapes as shown in FIGS. 4 and 5. In example embodiments, as shown in FIG. 4, upper and lower surfaces of the protective pattern 160b may have a slope, so that the protective pattern 160b have a sharp shape toward the end portion in the second direction. In example embodiments, as shown in FIG. 5, the end portion of the protective pattern 160b may have a rounded shape.

When the channel connection layer 158a is etched, the protective layer 158b may be lightly etched to form the lower connection structure 160 having a shape as shown in FIG. 6. In example embodiments, as shown in FIG. 6, upper and lower surfaces of the protective pattern 160b may be flat, and an end portion may have a vertical slope. Thus, the protective pattern 160b may have the same height in the vertical direction according to positions thereof.

For example, the channel connection layer 158a may include polysilicon doped with N-type impurities, and the protective layer 158b may include undoped polysilicon, polysilicon doped with P-type impurities, or polysilicon doped with N-type impurities having a concentration lower than a doped concentration of the channel connection layer. In this case, the protective layer 158b and the channel connection layer 158a may be removed by an isotropic dry etching process using an etching gas including a halogen gas. For example, the etching gas may include HBr, Cl$_2$, F$_2$, HCl, ClF$_3$, or the like.

The channels 136 may be electrically connected to the substrate 100 by the lower connection structure 160.

Figure 22:
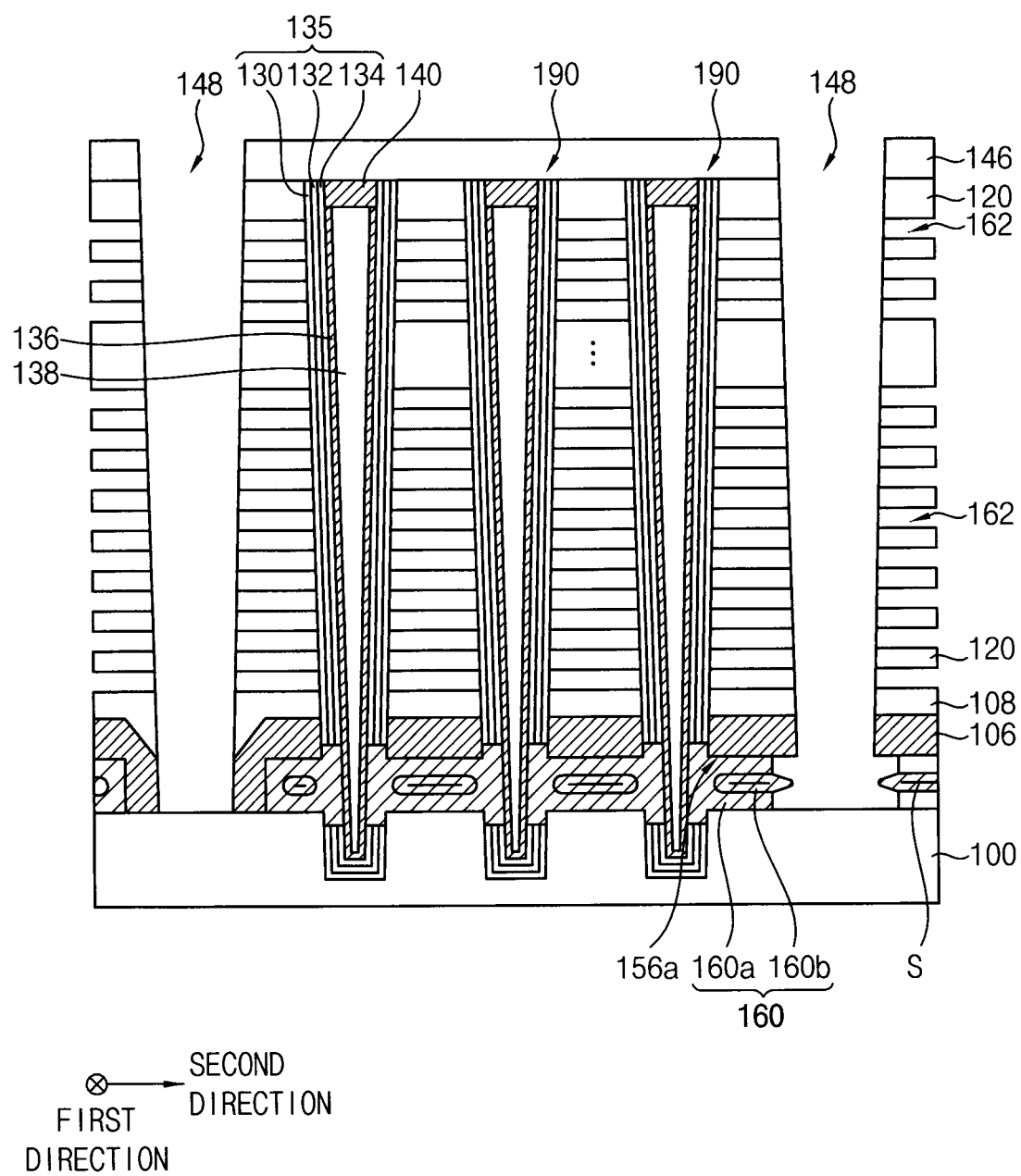

Referring to FIG. 22, the second sacrificial layers 122 exposed by the sidewall of the trench 148 may be removed to form second gaps 162 between the insulation layers 120. A portion of an outer wall of the blocking pattern 130 may be exposed by the second gap 162. The removing process of the second sacrificial layers 122 may include a wet etching process.

Figure 23:
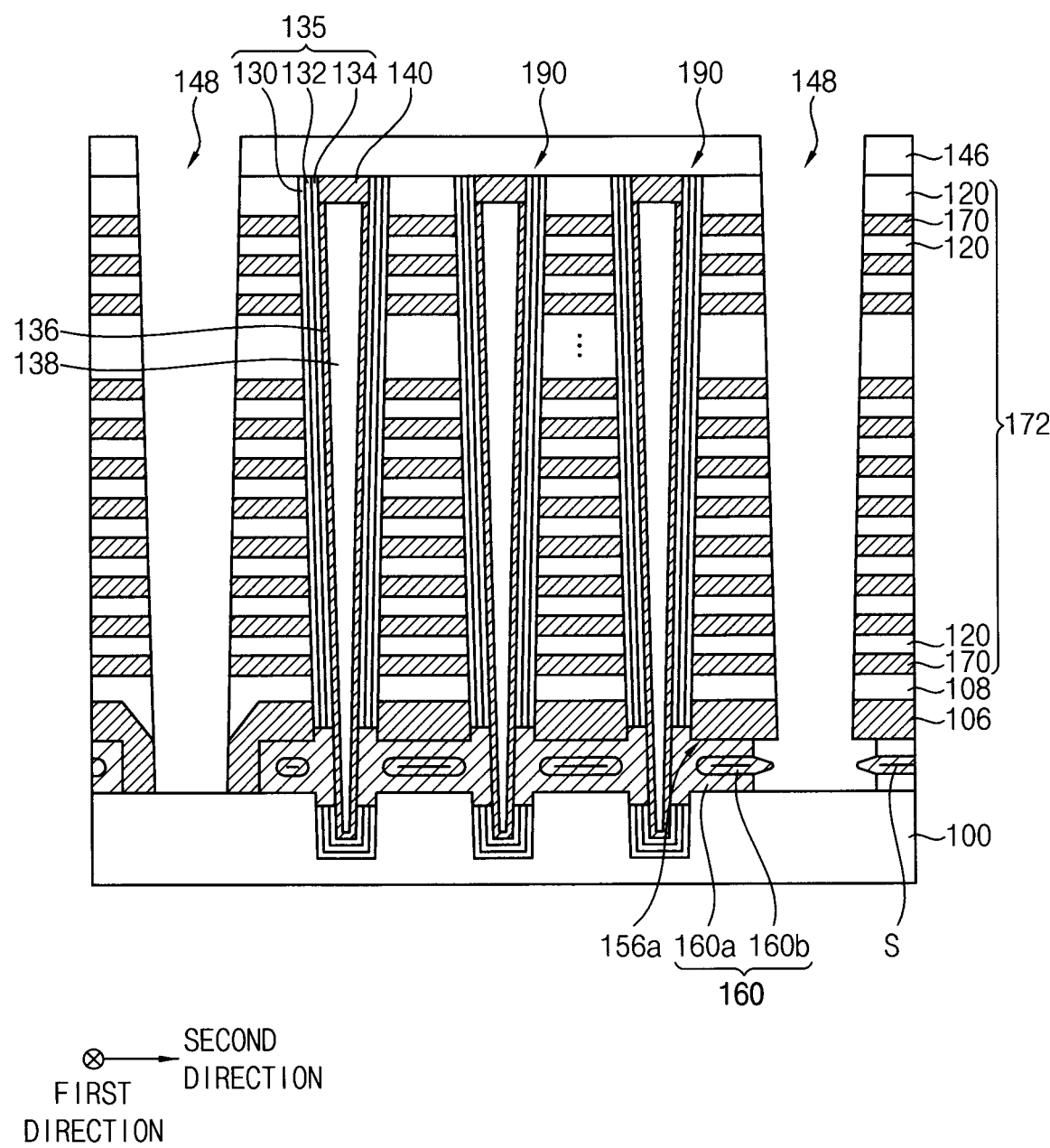

Referring to FIG. 23, a second blocking layer (not shown) may be conformally formed on surfaces of the trench 148 and the second gaps 162, and a gate electrode layer may be formed on the second blocking layer to fill the second gaps 162.

In example embodiments, the gate electrode layer may include a barrier layer (not shown) and a gate conductive layer sequentially stacked. The gate electric layer may include a metal having low electrical resistance such as tungsten, titanium, tantalum, platinum, or the like, and the barrier layer may include a metal nitride such as tungsten nitride, titanium nitride, tantalum nitride, or the like.

Thereafter, the gate electrode layer may be partially removed to form a gate electrode 170 filling the second gaps 162. In example embodiments, the gate electrode layer formed in the trench 148 may be removed. The removing process may include a wet etching process. The gate electrode 170 may extend in the first direction.

Thus, a stacked structure 172 including the insulation layers 120 and the gate electrodes 170 alternately and repeatedly stacked may be formed, and the stacked structure 172 may extend in the first direction.

Figure 24:
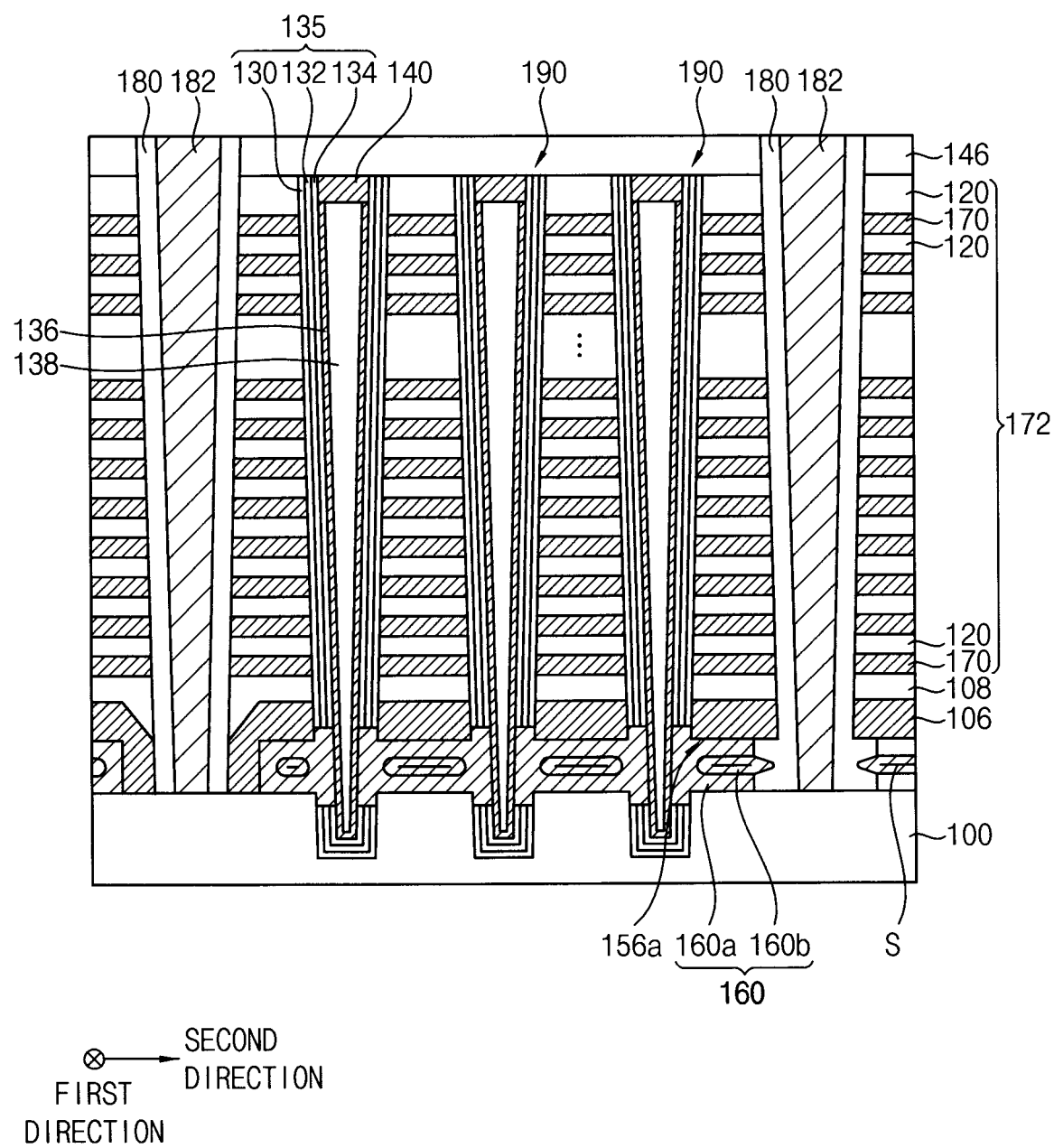

Referring to FIG. 24, an insulation spacer layer may be formed on the sidewall of the trench 148. The insulation spacer layer may be anisotropically etched, so that the substrate may be exposed by the bottom of the trench. Therefore, an insulation spacer 180 may be formed on the sidewall of the trench 148. The insulation spacer 180 may include silicon oxide.

Thereafter, a conductive layer may be formed on the first insulating interlayer 146 to fill the trench 148. The conductive layer may be planarized until an upper surface of the first insulating interlayer 146 may be exposed to form a common source pattern 182. The common source pattern 182 may include, e.g., a barrier metal layer and a metal pattern. The barrier metal layer may include metal nitrides such as tungsten nitride, titanium nitride, tantalum nitride, or the like. The metal pattern may include a metal having low electrical resistance such as tungsten, titanium, tantalum, platinum, or the like.

Although not shown, an upper insulating interlayer may be formed on the first insulating interlayer 146, the common source pattern 182 and the insulation spacer 180, and then upper wirings may be formed to be electrically connected to each of the capping pattern 140, the common source pattern 182 and the gate electrode 170.

Figure 25:
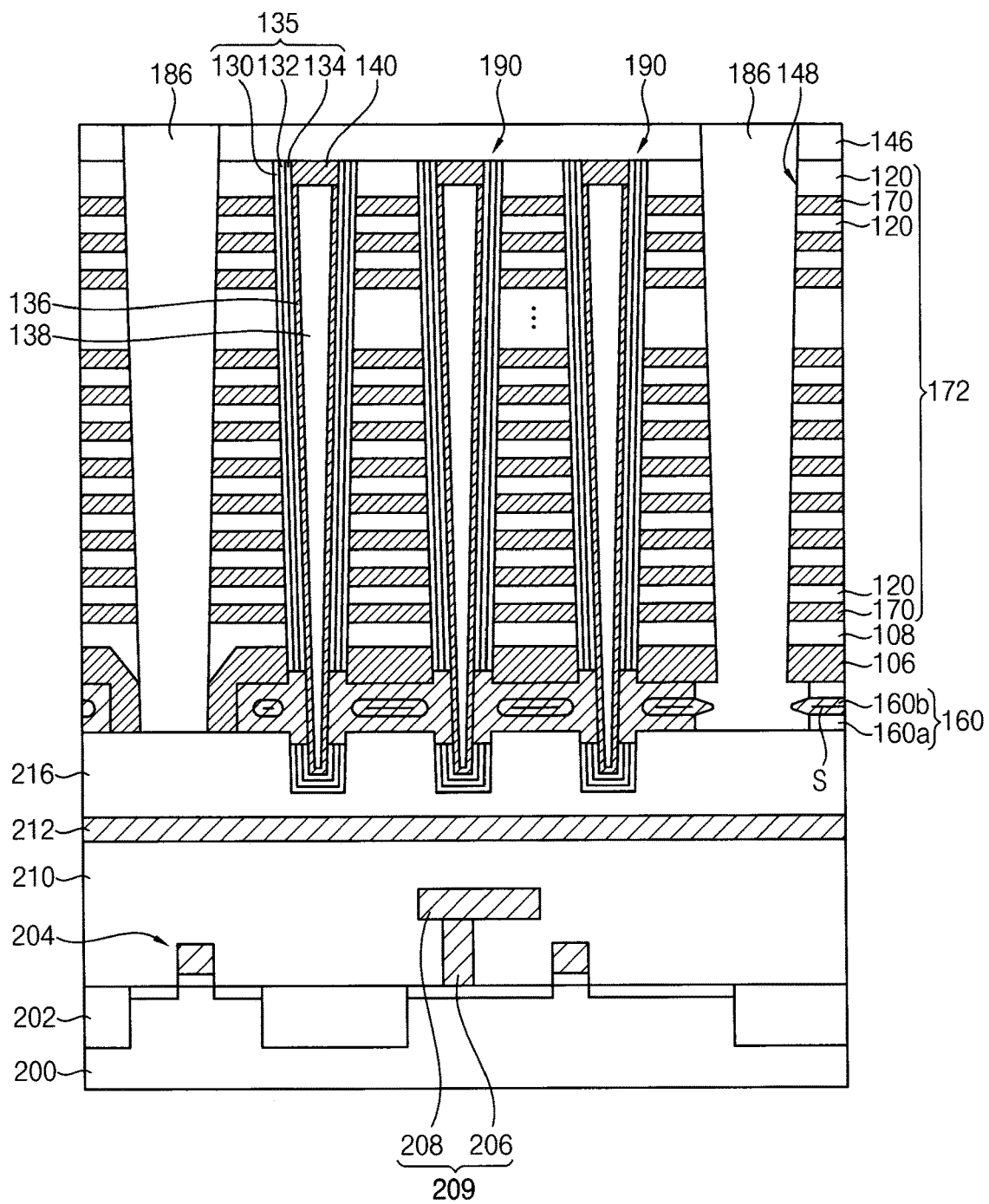

FIG. 25 is a cross-sectional view illustrating a vertical semiconductor device in accordance with example embodiments.

The vertical semiconductor device may have a cell on peri (COP) structure in which peripheral circuits may be formed under memory cells. That is, the peripheral circuits for driving the memory cells may be formed on a substrate disposed below the memory cells.

Referring to FIG. 25, circuit patterns serving as the peripheral circuits may be formed on a lower substrate 200. Lower wirings 209 may be formed to be electrically connected to the circuit patterns. A lower insulating interlayer 210 may be formed to cover the circuit patterns.

The lower substrate 200 may be divided into a field region in which a device isolation pattern 202 is formed and an active region in which a device isolation pattern 202 is not formed.

The circuit pattern may include a transistor 204, a resistor, a capacitor, or the like. The transistor 204 may include a gate and source/drain.

The lower wirings 209 may include lower contact plugs 206 and a conductive line 208. The lower wirings 209 may be formed in multiple layers. The lower insulating interlayer 210 may include silicon oxide.

The lower wirings 209 may be formed in the lower insulating interlayer 210. An uppermost portion of the lower insulating interlayer 210 may be flat.

A lower conductive pattern 212 may be formed on the lower insulating interlayer 210. In example embodiments, the lower conductive pattern 212 may serve as a common source line. In example embodiments, the lower conductive pattern 212 may include a metal or a metal silicide. For example, the lower conductive pattern 212 may include tungsten, copper, aluminum, tungsten silicide, cobalt silicide, or the like.

A base layer 216 may be formed on the lower conductive pattern 212. The base layer 216 may include, e.g., a polysilicon layer or a single crystal silicon layer.

In example embodiments, the base layer 216 may serve as an upper substrate.

A structure may be formed on the base layer, and the structure may be similar to a semiconductor device illustrated with reference to FIGS. 1 to 3. The structure formed on the base layer 216 may be substantially the same as illustrated with reference to FIGS. 1 to 3, except for a common source pattern.

In the example embodiments, the common source pattern may be formed under the base layer 216, and the common source pattern may have a line shape. Therefore, in this case, the insulation spacer and the common source pattern may not be formed in the trench 148. That is, an insulation pattern 186 may be formed in the trench 148. The insulation pattern 186 may include silicon oxide. In example embodiments, a contact plug contacting the common source pattern may be formed in the trench 148.

Figure 26:
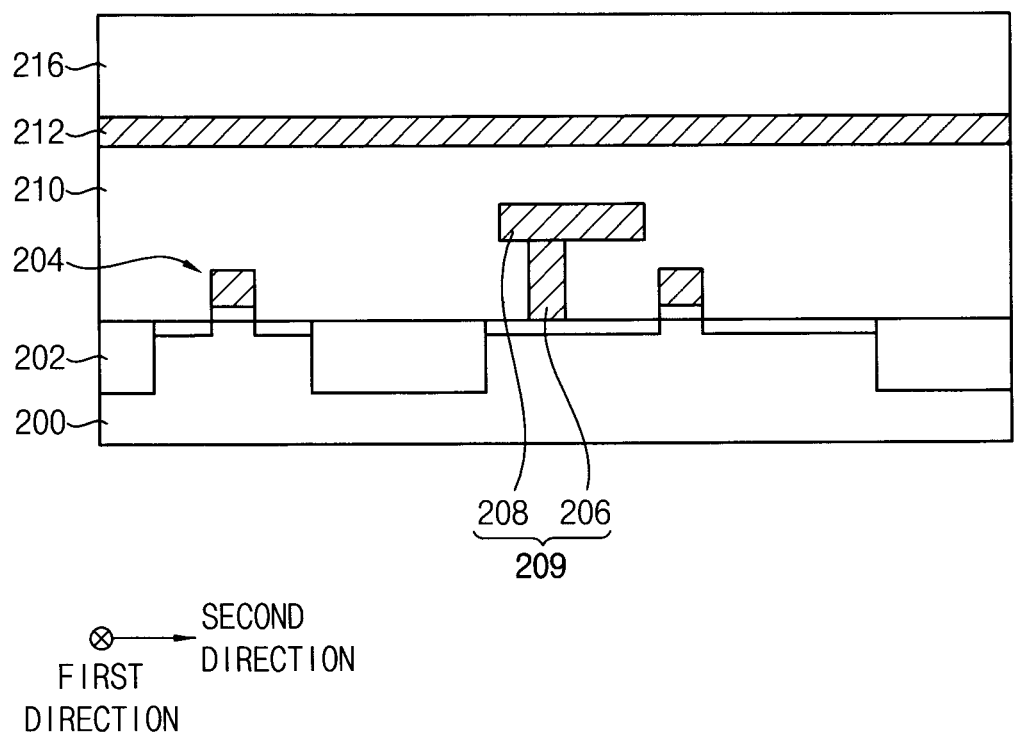
Figure 27:
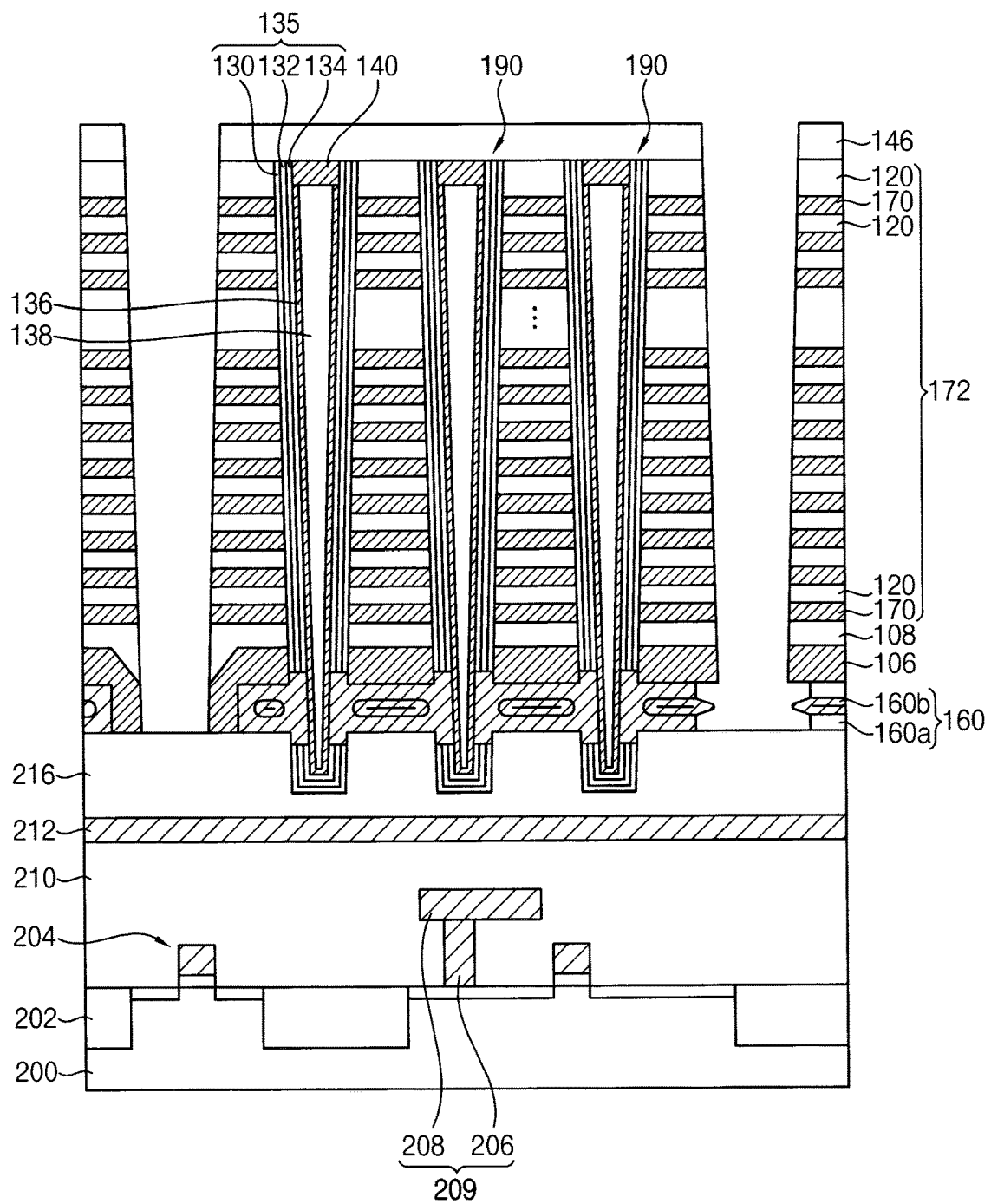

FIGS. 26 and 27 are cross-sectional views illustrating stages of a method of manufacturing a vertical semiconductor device in accordance with example embodiments.

Referring to FIG. 26, circuit patterns constituting a peripheral circuit may be formed on the lower substrate 200. Lower wirings 209 may be formed to be electrically connected to the circuit patterns, and a lower insulating interlayer 210 may be formed to cover the circuit patterns. A lower conductive pattern 212 and a base layer 216 may be sequentially formed on the lower insulating interlayer 210.

Before forming the circuit patterns, a trench isolation process may be performed on the lower substrate 200 to form a field region in which a device isolation pattern 202 is formed and an active region in which the device isolation pattern 202 is not formed.

In example embodiments, an upper surface of the lower insulating interlayer 210 may be planarized, after forming the lower insulating interlayer 210.

Referring to FIG. 27, the same process as illustrated with reference to FIGS. 6 to 23 may be performed on the base layer 216. Thus, the structure shown in FIG. 23 may be formed on the base layer 216.

Referring to FIG. 25 again, an insulation layer may be formed to completely fill the trench 148, and the insulation layer may be planarized to form an insulation pattern 186 in the trench 148. The insulation layer may include silicon oxide. Therefore, the semiconductor device shown in FIG. 25 may be manufactured.

Figure 28:
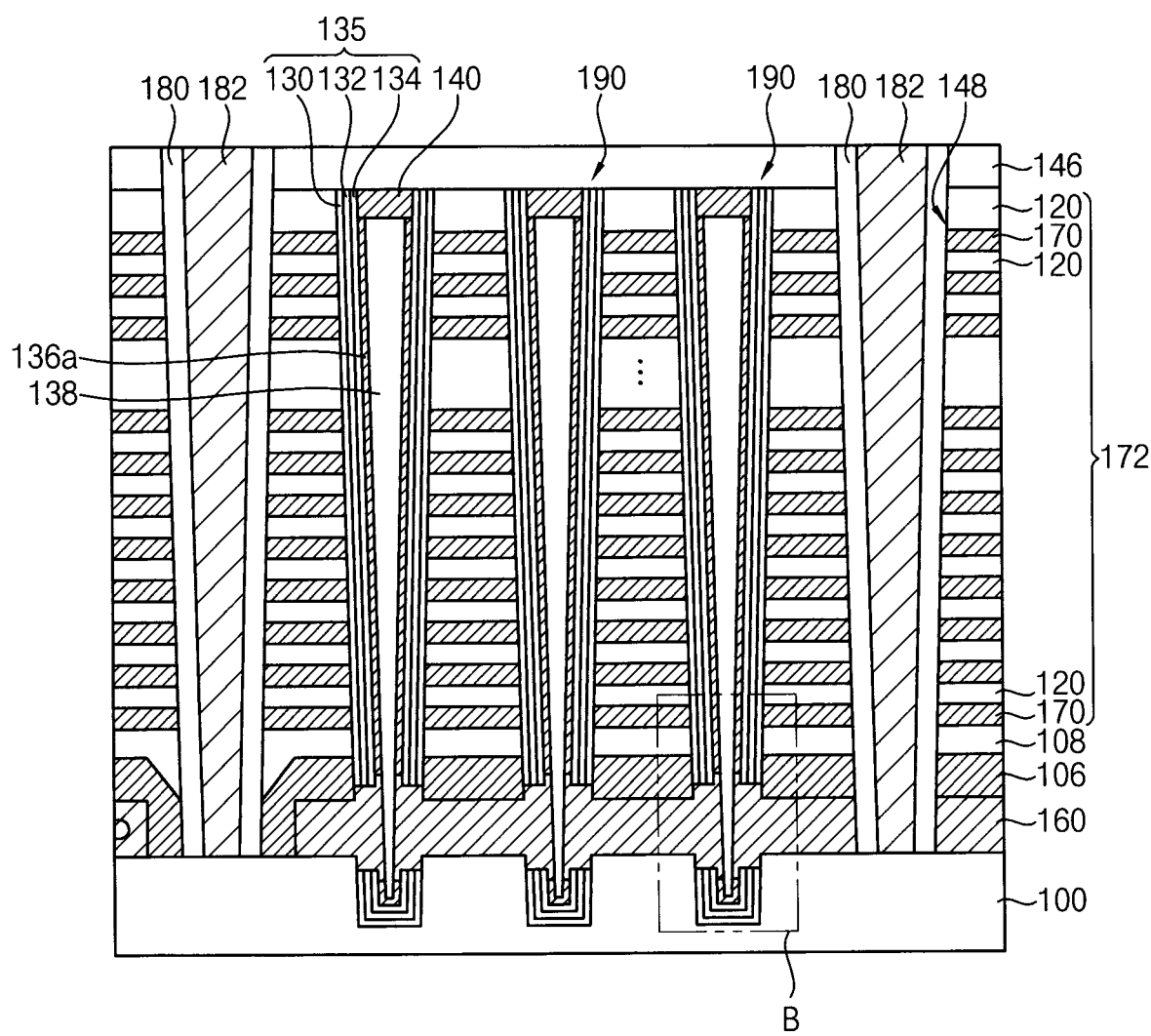

FIG. 28 is a cross-sectional view illustrating a vertical semiconductor device in accordance with example embodiments. FIGS. 29 to 33 are enlarged cross-sectional views of portions of vertical semiconductor devices in accordance with example embodiments, respectively.

Figure 29:
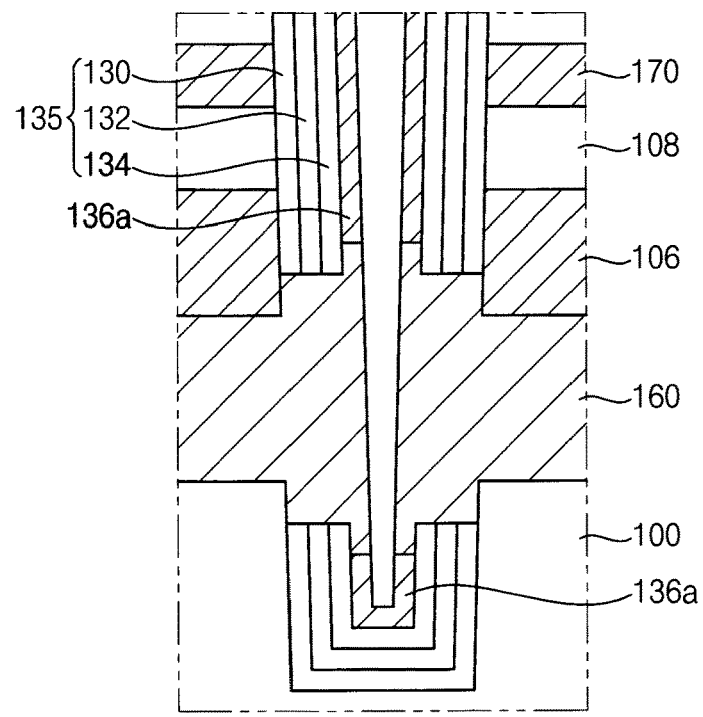

FIGS. 29 to 33 are enlarged views of a lower connection structure and channel structure portions. FIG. 29 is an enlarged view of a portion B of FIG. 28.

Each of the vertical semiconductor devices may be substantially the same as the vertical semiconductor device described with reference to FIG. 1, except for the lower connection structure and the channel.

Referring to FIGS. 28 and 29, in the vertical semiconductor device, the lower connection structure 160 may be electrically connected with the channel 136a included in the channel structure 190 and the substrate 100.

In example embodiments, the channel 136a may have a cylindrical shape having a partially cutting portion in the channel hole 126 (refer to FIG. 9). Particularly, the channel 136a may have a cutting portion at a portion facing the lower connection structure 160. In example embodiments, a portion of the channel 136a may remain below the bottom of the lower connection structure 160 in the channel hole 126. That is, the channel 136a may include an upper channel and a lower channel. The upper channel and the lower channel may be spaced apart from each other in the vertical direction, and the lower connection structure may electrically connect the upper channel and the lower channel.

In example embodiments, a bottom of the upper channel may have a height the same as a top of the cutting portion of the charge storage structure 135, or higher than the top of the cutting portion of the charge storage structure 135. A top surface of the lower channel may have a height the same as a bottom of the cutting portion of the charge storage structure 135, or higher than the bottom of the cutting portion of the charge storage structure 135.

The lower connection structure 160 may contact the bottom of the upper channel and the top surface of the lower channel, respectively. The lower connection structure 160 may not contact an outer wall of the channel 136a. Thus, a contact area between the channel 136a and the lower connection structure 160 may be reduced. The channel 136a may be physically separated from itself by the cutting portion, and the channel 136a may be electrically connected by the lower connection structure 160.

At least a portion of the lower connection structure 160 contacting the channel may include polysilicon doped with impurities. In example embodiments, the lower connection structure 160 may include polysilicon doped with N-type impurities such as phosphorous, arsenic, or the like. Impurities of the lower connection structure 160 may diffuse into the channel 136a adjacent to the lower connection structure 160. However, the contact area between the channel 136a and the lower connection structure 160 may be reduced, so that an area of diffusion source including the impurities of the lower connection structure 160 may be decreased. Therefore, the diffusion of the impurities to an upper portion of the channel 136a may be decreased, and the diffusion of the impurities may be easily controlled.

In example embodiments, a gate-induced drain leakage (GIDL) transistor may be formed on the lower connection structure 160 to erase data of cells in the vertical semiconductor device. When impurities included in the lower connection structure 160 are excessively diffused into the channel 136a or diffusion of the impurities is not controlled, characteristics of the GIDL transistor may be difficult to maintain. However, in example embodiments, the diffusion of the impurities may be easily controlled, so that a distribution of the characteristic of the GIDL transistor may be uniformly maintained.

Figure 30:
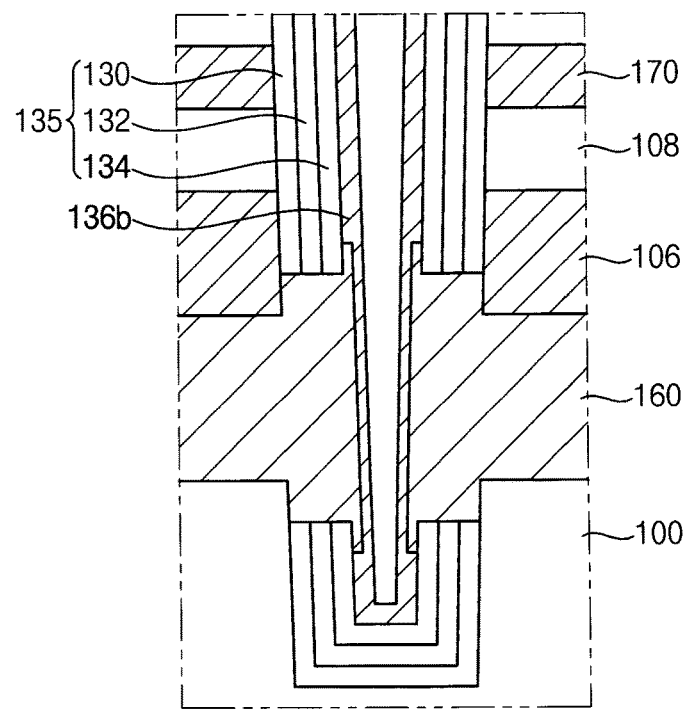

In some example embodiments, as shown in FIG. 30, the channel 136b may have a cylindrical shape in the channel hole 126, and a portion of the channel 136b may have a relatively thin width. Particularly, the channel 136b may have the relatively thin width at a portion facing the lower connection structure 160.

That is, the channel 136b may include an upper channel, a lower channel and a connection portion. The connection portion may be formed between the upper channel and the lower channel, and the connection portion may connect the upper channel and the lower channel. The width of the connection portion may be less than a width of each of the upper channel and the lower channel. As the connection portion is formed, the channel 136b may have a cylindrical shape having no cutting portion.

The lower connection structure 160 may contact the portion having the relatively thin width in the channel 136b, that is an outer wall of the connection portion of the channel 136b. As a width of the channel 136b has a relatively thin width at a contact portion between the channel 136b and the lower connection structure 160, a width of the diffusion path of the impurities of the lower connection structure 160 may be decreased. Therefore, the diffusion of the impurities to an upper portion of the channel 136a may be decreased, and the diffusion of the impurities may be easily controlled.

In example embodiments, the lower connection structure 160 may be one channel connection pattern including polysilicon doped with impurities.

Figure 31:
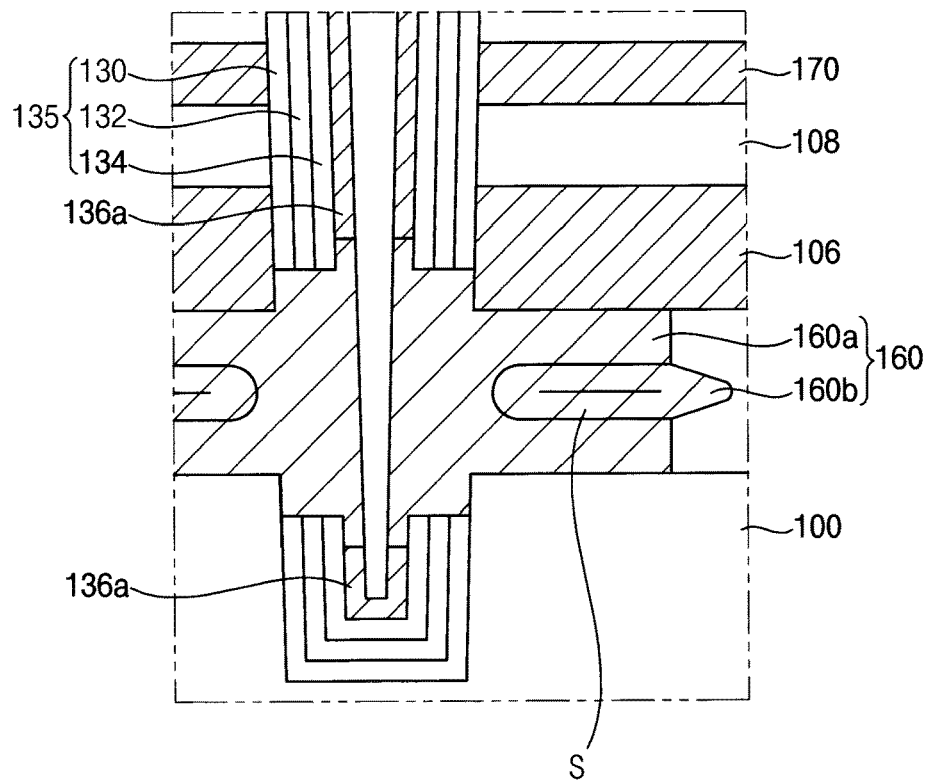
Figure 32:
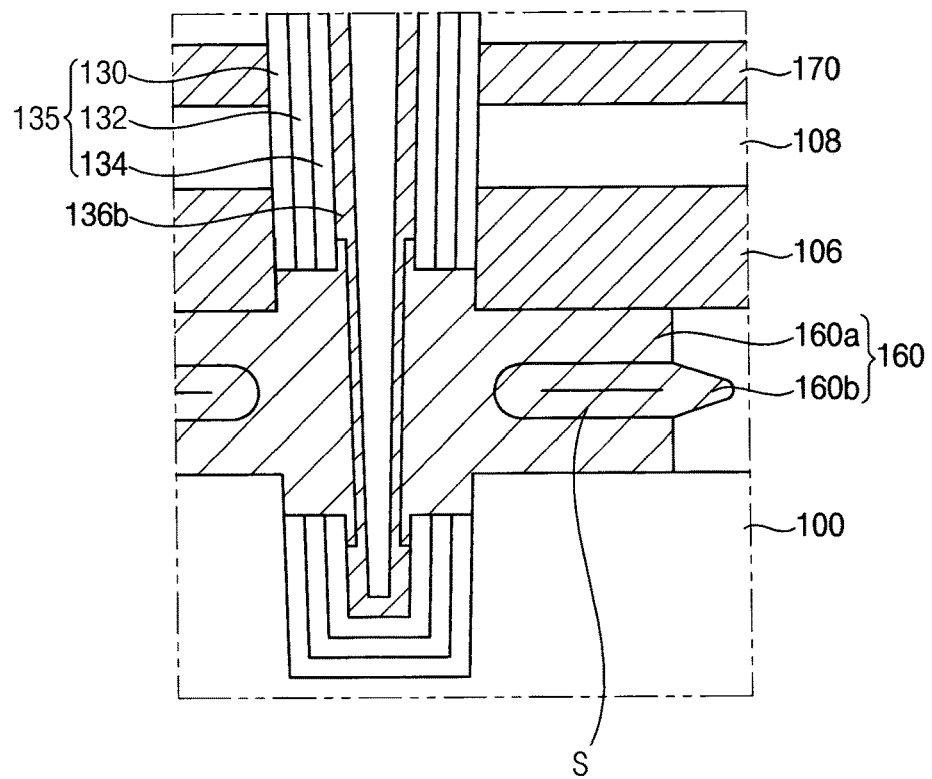

In some example embodiments, as shown in FIGS. 31 and 32, the lower connection structure 160 may include a channel connection pattern 160a and a protective pattern 160b, as illustrated with reference to FIG. 1.

Figure 33:
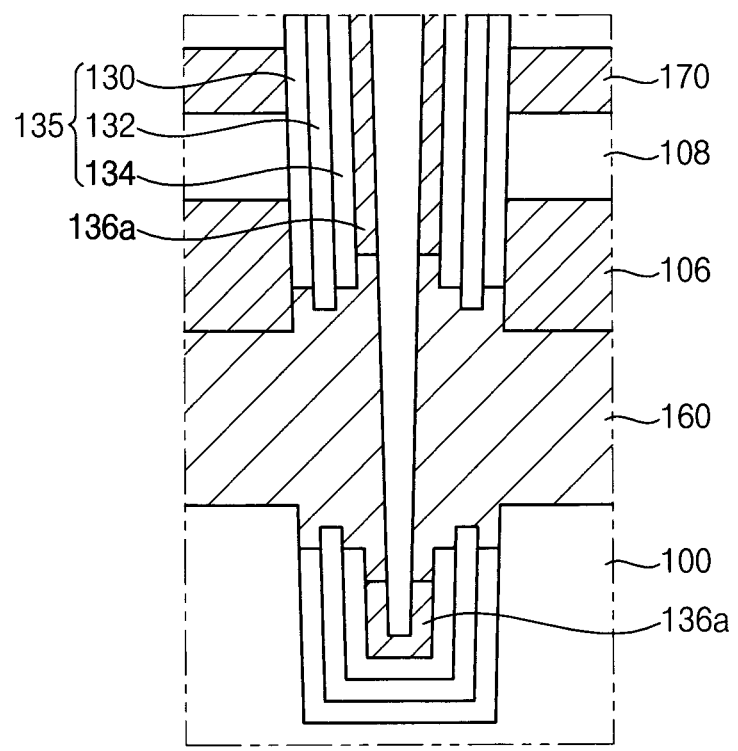

In some example embodiments, as shown in FIG. 33, the charge storage structure 135 may have a cutting portion adjacent to the lower connection structure 160. Also, heights of the cutting portions of the tunnel insulation pattern 134, the charge storage pattern 132, and the blocking pattern 130 included in the charge storage structure 135 may not be the same to each other. In etching processes of layers included in the charge storage structure 135, etch rates of the tunnel insulating layer, the charge storage layer, and the blocking layer may be different.

In example embodiments, as shown in FIG. 33, the charge storage pattern 132 may protrude from the tunnel insulation pattern 134 and the blocking pattern 130. That is, an upper portion of the cutting portion of the charge storage pattern 132 may protrude downward from an upper portion of the cutting portion of each of the tunnel insulation pattern 134 and the blocking pattern 130. Also, a lower portion of the cutting portion of the charge storage pattern 132 may protrude upward from a lower portion of the cutting portion of each of the tunnel insulation pattern 134 and the blocking pattern 130. Thus, a top of the cutting portion of the charge storage pattern 132 may be lower than a top of a cutting portion of each of the tunnel insulation pattern 134 and the blocking pattern 130. Also, a bottom of the cutting portion of the charge storage pattern 132 may be higher than a bottom of the cutting portion of each of the tunnel insulation pattern 134 and the blocking pattern 130.

In some example embodiments, although not shown, the tunnel insulation pattern 134 and the blocking pattern 130 may protrude from the charge storage pattern 132. That is, a top of the cutting portion of the charge storage pattern 132 may be higher than a top of the cutting portion of each of the tunnel insulation pattern 134 and the blocking pattern 130. Also, a bottom of the cutting portion of the charge storage pattern 132 may be lower than a bottom of the cutting portion of each of the tunnel insulation pattern 134 and the blocking pattern 130.

Figure 34:
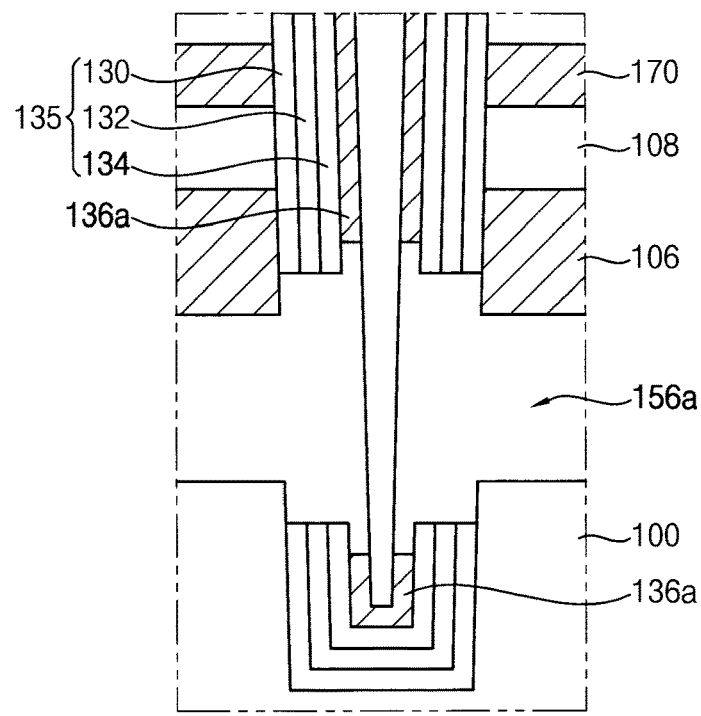
Figure 35:
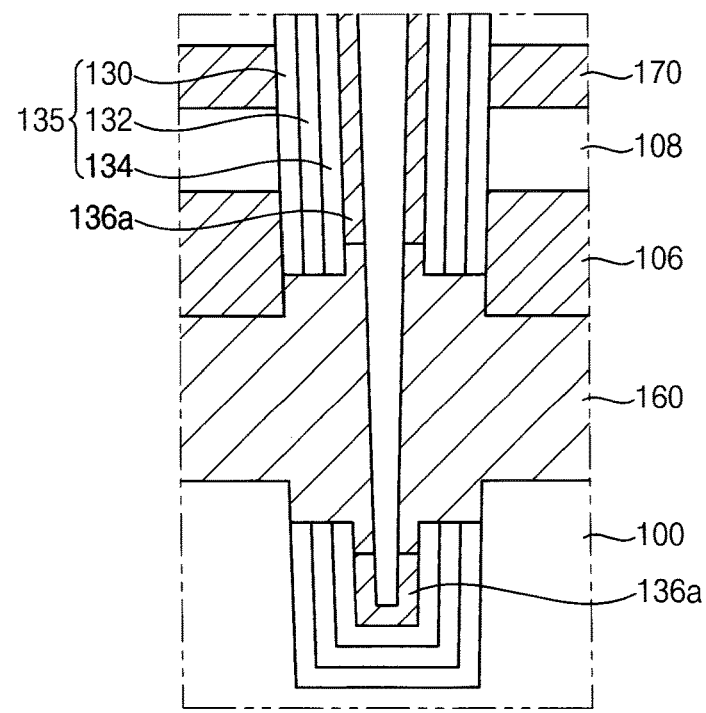

FIGS. 34 and 35 are cross-sectional views illustrating stages of a method of manufacturing a vertical semiconductor device in accordance with example embodiments.

The manufacturing methods of the vertical semiconductor devices shown in FIGS. 28, 29 and 31 are described. Each of the vertical semiconductor devices may be manufactured by processes substantially the same as illustrated with reference to FIGS. 7 to 24, except for a lower connection structure and a channel.

First, the same processes as illustrated with reference to FIGS. 7 to 15 are performed to form a structure shown in FIG. 15.

Referring to FIG. 34, an outer wall of a lower portion of the channel exposed by the first gap 156a may be further etched, so that the channel 136a may have a cutting portion by the first gap 156a. Therefore, a sidewall of the filling pattern 138 may be exposed by the first gap 156a. During the etching process, the insulation layer and the sacrificial layer may be lightly etched. That is, in the etching process, a polysilicon may be selectively etched while a silicon oxide layer and a silicon nitride layer may be lightly etched. The etching process may include an isotropic etching process. In the etching process, an etching source may use an etching gas or an etching solution.

Referring to FIG. 35, a channel connection layer may be formed to completely fill the first gap 156a. The channel connection layer may be formed to fill the cutting portion of the channel 136a, so that the channel 136a may be electrically connected by the channel connection layer.

In example embodiments, the process for forming the channel connection layer may be performed in-situ or ex-situ with the etching process of a portion of the channel 136a.

Thereafter, the channel connection layer formed on a sidewall and a bottom of the trench 148 and the first insulating interlayer 146 may be removed to form the lower connection structure 160 filling the first gap 156a.

A portion of the lower connection structure 160 contacting the channel 136a may include polysilicon doped with impurities. In example embodiments, the lower connection structure 160 may include polysilicon doped with N-type impurities such as phosphorous, arsenic, or the like.

Subsequently, by performing the process illustrated with reference to FIGS. 22 to 24, a vertical semiconductor device including a structure as illustrated in FIG. 28 may be manufactured.

In some example embodiments, the process illustrated with reference to FIG. 34 may be performed, and then the same process as illustrated with reference to FIGS. 16 to 24 may be performed. However, when the process illustrated with reference to FIG. 16 is performed, the channel connection layer may be formed to fill the cutting portion of the channel. In this case, a vertical semiconductor device including a lower connection structure 160 having a shape as shown in FIG. 31 may be manufactured.

As described above, excessive diffusion of impurities of the channel connection layer into the channel may be decreased, when subsequent processes are performed after forming the channel connecting layer.

Figure 36:
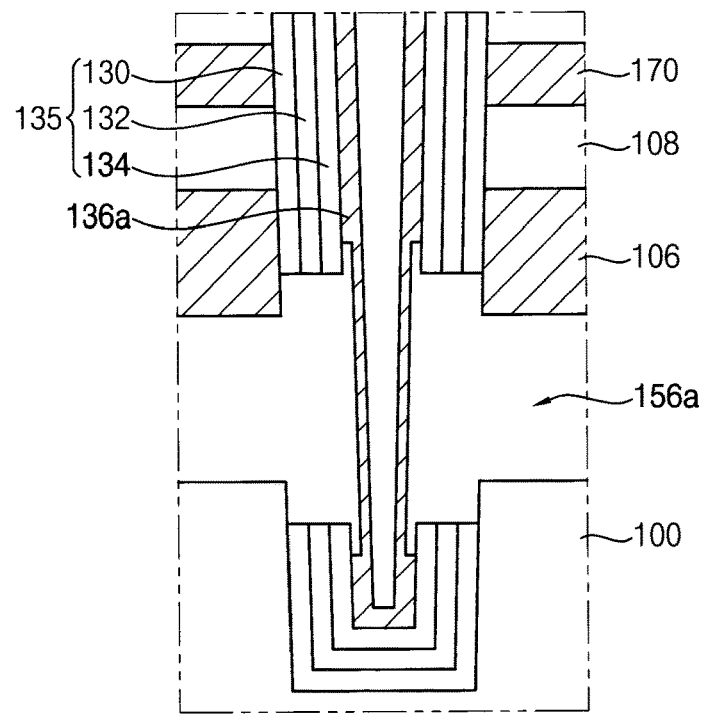
Figure 37:
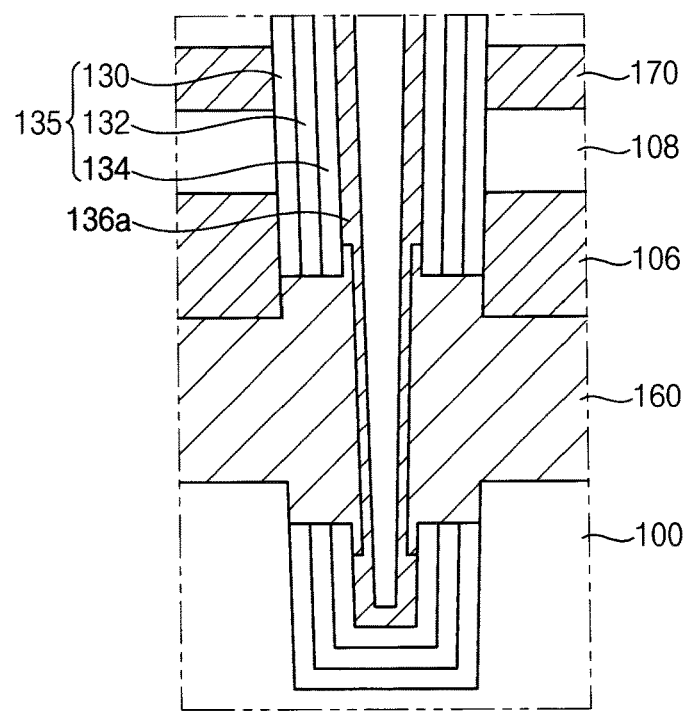

FIGS. 36 and 37 are a cross-sectional view and a plan view illustrating stages of a method of manufacturing a vertical semiconductor device in accordance with example embodiments.

The manufacturing method of the vertical semiconductor devices shown in FIGS. 30 to 32 is described. Each vertical semiconductor device may be manufactured by processes substantially the same as illustrated with reference to FIGS. 7 to 24, except for a lower connection structure and a channel.

First, the same processes as illustrated with reference to FIGS. 7 to 15 are performed to form a structure shown in FIG. 15.

Next, referring to FIG. 36, an outer wall of a lower portion of the channel exposed by the first gap 156a may be further etched, so that the channel 136b may have a relatively thin thickness at a portion facing the first gap 156a.

Referring to FIG. 37, a channel connection layer may be formed to completely fill the first gap 156a. The channel connection layer may contact a portion having relatively thin thickness in the channel 136b. Therefore, the channel 136b may be electrically connected by the channel connection layer.

Thereafter, the process illustrated with reference to FIG. 35 may be performed, and then the same process as illustrated with reference to FIGS. 22 to 24 may be performed. In this case, a vertical semiconductor device shown in FIG. 30 may be manufactured.

In some example embodiments, the process illustrated with reference to FIG. 36 may be performed, and then the same process as illustrated with reference to FIGS. 16 to 24 may be performed. In this case, a vertical semiconductor device shown in FIG. 32 may be manufactured.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical semiconductor device comprising:
   a stacked structure including insulation layers and gate electrodes alternately repeatedly stacked, the stacked structure being spaced apart from an upper surface of a substrate;
   a channel structure including a charge storage structure and a channel, the channel structure passing through the stacked structure; and
   a lower connection structure formed on the substrate, the lower connection structure being electrically connected with the channel and the substrate, wherein a sidewall of the lower connection structure includes one protrusion disposed at a central portion of the sidewall from the upper surface of the substrate in a vertical direction, wherein:
   the channel structure includes a plurality of channel structures, and
   the lower connection structure contacts a surface of the substrate, and the lower connection structure fills a gap between the upper surface of the substrate and the stacked structure and a portion between lower portions of the channel structures.

2. The vertical semiconductor device of claim 1, wherein the lower connection structure includes a channel connection pattern having conductivity and a protective pattern, and an end portion of the protective pattern correspond to the protrusion.

3. The vertical semiconductor device of claim 2, wherein the channel connection pattern is conformally formed on an upper surface of the gap, a sidewall of channel and a lower surface of the gap, and wherein the protective pattern is disposed between a first portion of the channel connection pattern formed on the upper surface of the gap and a second portion of the channel connection pattern formed on the lower surface of the gap.

4. The vertical semiconductor device of claim 2, wherein the protective pattern includes a material having an etching rate lower than that of the channel connection pattern, in the same etching process.

5. The vertical semiconductor device of claim 2, wherein the channel connection pattern includes polysilicon doped with conductive impurities.

6. The vertical semiconductor device of claim 5, wherein the protective pattern includes undoped polysilicon.

7. The vertical semiconductor device of claim 5, wherein the protective pattern includes an insulation material or a polysilicon doped with non-conductive impurities.

8. The vertical semiconductor device of claim 2, wherein upper and lower surfaces of the protective pattern have slope, and the protective pattern have a sharp shape toward an end portion thereof in a second direction.

9. The vertical semiconductor device of claim 2, wherein a seam is included in the protective pattern.

10. The vertical semiconductor device of claim 1, further comprising a support layer between the lower connection structure and the stacked structure.

11. The vertical semiconductor device of claim 1, further comprising an insulation spacer covering sidewalls of the stacked structure and the lower connection structure, and a common source pattern contacting the insulation spacer and the substrate and extending in a first direction.

12. The vertical semiconductor device of claim 1, wherein:
   the channel structure is formed in a channel hole extending through the stacked structure to an upper portion of the substrate, and
   the charge storage structure is formed on an upper sidewall of the channel hole higher than the lower connection structure, and the channel contacts the charge storage structure and the lower connection structure and has a cylindrical shape.

13. The vertical semiconductor device of claim 1, wherein the channel includes an upper channel and a lower channel, the upper channel and the lower channel are spaced apart from each other in a vertical direction, and the lower connection structure is electrically connected with the upper channel and the lower channel.

14. The vertical semiconductor device of claim 1, wherein the channel comprises an upper channel, a lower channel and a connection portion, wherein the connection portion connects the upper channel and the lower channel, and a width of the connection portion is less than a width of each of the upper channel and the lower channel.

15. The vertical semiconductor device of claim 1, further comprising:
   circuit patterns formed on a lower substrate;
   a lower insulating interlayer covering the circuit patterns; and
   a lower conductive pattern formed on the lower insulating interlayer, wherein
   the substrate is disposed on the lower conductive pattern.

16. The vertical semiconductor device of claim 1, wherein upper and lower surfaces of the protrusion have slope, and the protrusion have a sharp shape toward an end portion thereof in a second direction.

17. A vertical semiconductor device comprising:
   a support layer being spaced apart from an upper surface of a substrate;
   a stacked structure formed on the support layer, the stacked structure including insulation layers and gate electrodes alternately and repeatedly stacked;
   a channel structure passing through the stacked structure and the support layer and extending to the upper surface of the substrate, the channel structure including a charge storage structure and a channel; and
   a lower connection structure formed on the substrate, the lower connection structure being electrically connected with the channel and the substrate, wherein
   an end portion of the lower connection structure disposed at a central portion in a vertical direction from the upper surface of the substrate protrudes from an end portion of each of the lower connection structure formed on a bottom of the support layer and the lower connection structure formed on the upper surface of the substrate to form one protrusion.

18. The vertical semiconductor device of claim 17, wherein the lower connection structure includes a channel connection pattern and a protective pattern, and the end portion of the protective pattern correspond to the protrusion.

19. A vertical semiconductor device comprising:
   a stacked structure including insulation layers and gate electrodes alternately and repeatedly stacked, the stacked structure being spaced apart from an upper surface of a substrate;
   a channel structure passing through the stacked structure and extending to an upper surface of the substrate, the channel structure including a charge storage structure and a channel; and
   a lower connection structure contacting the substrate to fill a gap between a surface of the substrate and the stacked structure, and the lower connection structure being electrically connected with the channel and the substrate, wherein:
   the lower connection structure includes a channel connection pattern and a protective pattern, and the protective pattern includes a material having an etching rate lower than that of the channel connection pattern, in the same etching process and
   a sidewall of the lower connection structure includes one protrusion disposed at a central portion of the sidewall from the upper surface of the substrate in a vertical direction.

* * * * *